(12) United States Patent
Ayazi et al.

(10) Patent No.: US 10,393,525 B2
(45) Date of Patent: Aug. 27, 2019

(54) MICRO-HEMISPHERICAL RESONATORS AND METHODS OF MAKING THE SAME

(71) Applicant: Georgia Tech Research Corporation, Atlanta, GA (US)

(72) Inventors: Farrokh Ayazi, Atlanta, GA (US); Peng Shao, Atlanta, GA (US); Xin Gao, Atlanta, GA (US); Vahid Tavassoli, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1029 days.

(21) Appl. No.: 14/719,743

(22) Filed: May 22, 2015

(65) Prior Publication Data

US 2016/0344368 A1 Nov. 24, 2016

(51) Int. Cl.
*G01C 19/5712* (2012.01)
*H03H 3/007* (2006.01)
*H03H 9/24* (2006.01)

(52) U.S. Cl.
CPC ....... *G01C 19/5712* (2013.01); *H03H 3/0072* (2013.01); *H03H 9/2405* (2013.01)

(58) Field of Classification Search
CPC ............ G01C 19/5705; G01C 19/5712; G01C 19/567
See application file for complete search history.

(56) References Cited

U.S. PATENT DOCUMENTS

| | | |
|---|---|---|
| 7,434,465 B1 | 10/2008 | Stewart |
| 7,624,494 B2 | 12/2009 | Challoner et al. |
| 8,166,816 B2 | 5/2012 | Ayazi et al. |
| 8,393,212 B2 | 3/2013 | Ge et al. |
| 8,631,702 B2 | 1/2014 | Horning et al. |

(Continued)

FOREIGN PATENT DOCUMENTS

| | | |
|---|---|---|
| CN | 103115616 A | 5/2013 |
| CN | 103322994 A | 9/2013 |

(Continued)

OTHER PUBLICATIONS

Hamelin, B., et al., "Eutectic Trimming of Polysilicon Micro Hemispherical Resonating Gyroscope," Georgia Institute of Technology, 2013.

(Continued)

*Primary Examiner* — Erika J Villaluna
(74) *Attorney, Agent, or Firm* — Troutman Sanders LLP; Ryan A. Schneider

(57) ABSTRACT

Aspects of the present disclosure relate to microelectromechanical systems (MEMS) and methods for fabricating MEMS. In some embodiments, the system includes a resonator and a support stem. In some embodiments, the resonator is a hemisphere. The system can further include a front-side or back-side DC contact. The system can further include a levitation support, by which the resonator is virtually levitated from a substrate. In some embodiments, the resonator can be suitable for use in a microhemispherical resonator gyroscope Aspects of the present disclosure also relate to methods for fabricating axisymmetric resonators, including resonators for use in microhemispherical resonator gyroscopes.

16 Claims, 26 Drawing Sheets

(56) References Cited

U.S. PATENT DOCUMENTS

| | | | | |
|---|---|---|---|---|
| 2011/0239763 A1* | 10/2011 | Shkel | ................ | G01C 19/5691 |
| | | | | 73/504.13 |
| 2013/0239682 A1* | 9/2013 | Painter | ............... | G01C 19/5691 |
| | | | | 73/504.13 |
| 2014/0021561 A1 | 1/2014 | Trusov et al. | | |
| 2016/0231113 A1* | 8/2016 | Rozelle | .............. | G01C 19/5691 |

FOREIGN PATENT DOCUMENTS

| | | | | |
|---|---|---|---|---|
| CN | 103344229 A | | 10/2013 | |
| JP | 2005348082 A | * | 12/2005 | ......... H03H 9/02094 |
| WO | 2013185417 A1 | | 12/2013 | |

OTHER PUBLICATIONS

Pai, P., et al., "MEMS-Based Hemispherical Resonator Gyroscopes," University of Utah, 2012.

Schwartz, D., et al., "A Model-Based Approach to Multi-Modal Mass Tuning of a Micro-Scale Resonator," University of California, Los Angeles.

Senkal, D., et al., "1 Million Q-Factor Demonstrated on Micro-Glassblown Fused Silica Wineglass Resonators With Out-Of-Plane Electrostatic Transduction," University of California, Irvine.

Shao, Peng, "Microscale Hemispherical Shell Resonator Gyroscopes," Nov. 13, 2013.

* cited by examiner

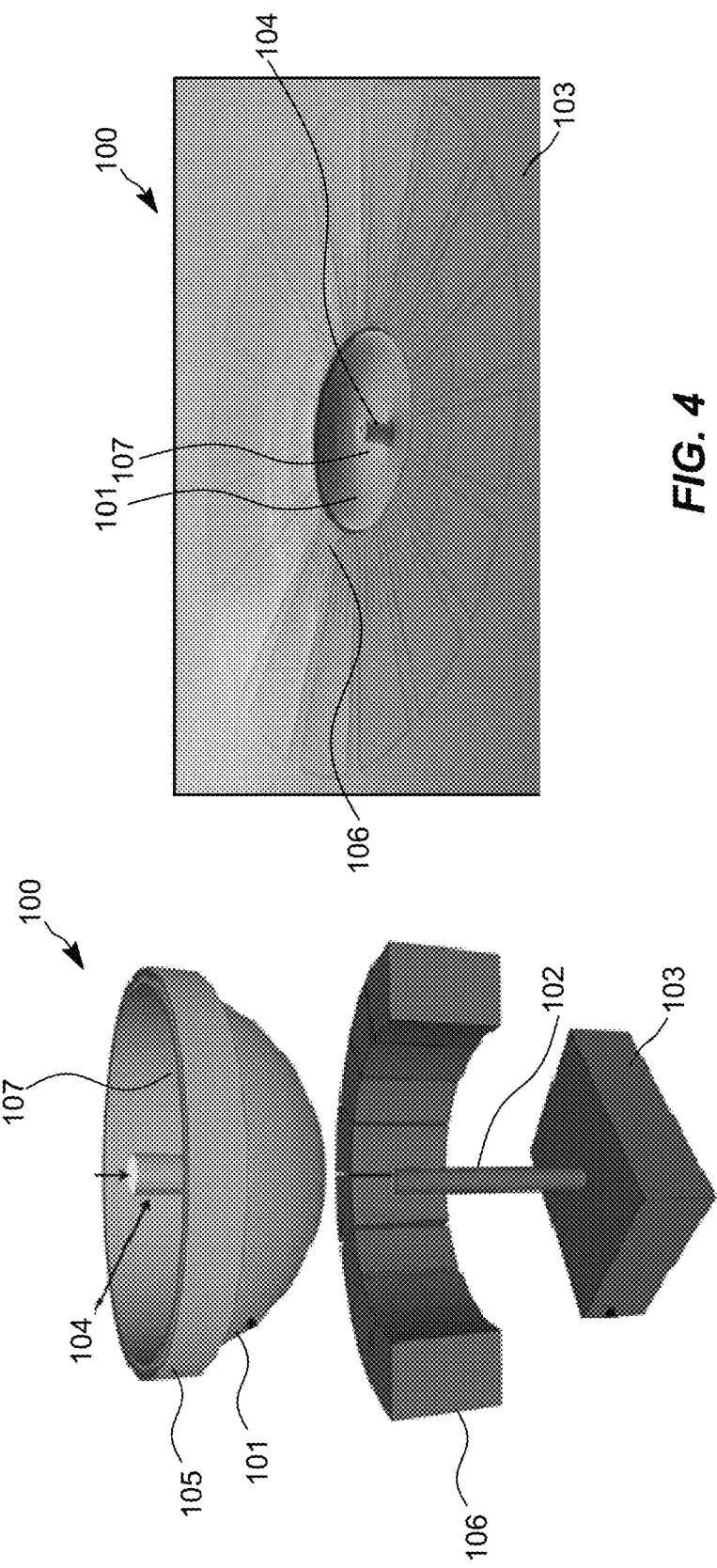

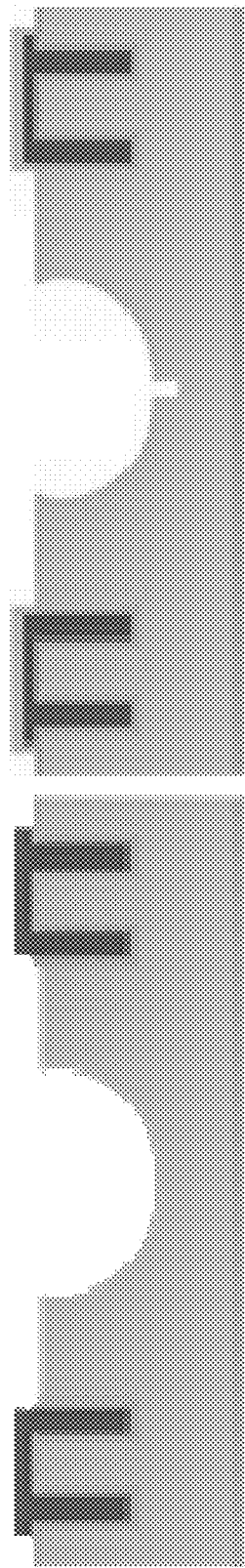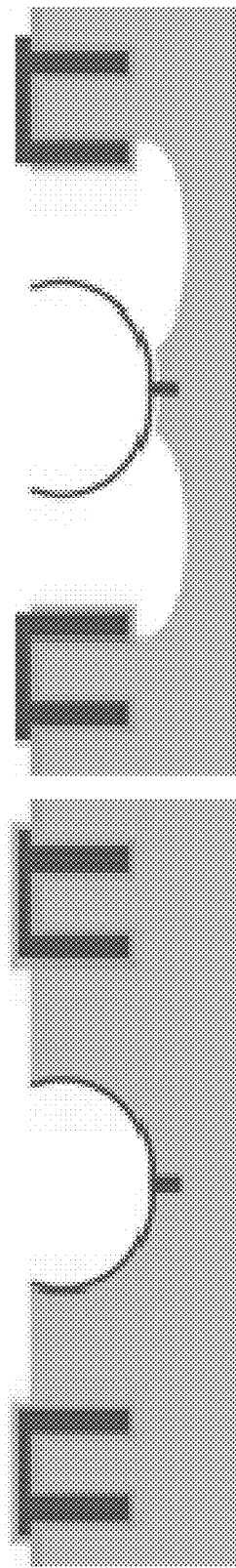
FIG. 29A  FIG. 29B  FIG. 29C  FIG. 29D

MICRO-HEMISPHERICAL RESONATORS AND METHODS OF MAKING THE SAME

STATEMENT OF FEDERALLY SPONSORED RESEARCH

This invention was made with government support under contract HR0011-00-C-0032 awarded by the Defense Advanced Research Projects Agency (DARPA). The government has certain rights in the invention.

TECHNICAL FIELD

The various embodiments of the disclosure relate generally to microelectromechanical systems (MEMS) and methods of making the same. More particularly, the embodiments relate to high quality factor axisymmetric resonators with long ring-down times.

BACKGROUND

Over the past decade, a significant amount of research has been directed towards the development of high performance and small size MEMS gyroscopes for consumer electronics applications. MEMS gyroscopes have also been investigated for inertial navigation systems, particularly for situations where GPS navigation will not function. For inertial navigation, the primary challenge is limiting the accumulation of angular error over time. Many MEMS gyroscopes operate in rate mode. In this mode, gyroscopes measure angular velocity, which must be computationally integrated over time to determine an angle of rotation. This produces integration errors that must be periodically recalibrated by, in some cases, an assisting GPS unit.

Whole angle gyroscopes, also referred to as rate integrating gyroscopes (RIGs), are capable of detecting an angle of rotation directly, eliminating the need for computational rate integration over time. Moreover, the dynamic range and bandwidth of a RIG are larger than rate gyros. Whole angle mode operation requires resonators that, once excited with a vibration, allow the vibration pattern to precess freely around the resonator as the device rotates. For this reason, the resonator must have a long ring-down time, a characteristic associated with low resonant frequencies and high quality factors (Q). These features make micro-fabrication of such sensors in small size challenging. Since resonant frequencies typically are inversely proportional to the size of the resonator, extreme miniaturization can significantly increase the resonant frequency of the resonator. For this reason, commercially available ultra high Q RIGs are usually golf-ball sized or larger.

RIGs must also be symmetric about an axis to allow a vibration to precess freely around the resonator as the device rotates. Several axisymmetric microstructures, such as rings, cylinders and disks, have been investigated to implement MEMS gyroscopes. Each of these has been unable to achieve the high Q and low resonant frequency necessary for whole angle mode operation. In contrast, the three dimensional shell structure of a micro-hemispherical resonating gyroscope (μHRG) can obtain a resonant frequency much lower than the frequency range of other MEMS structures. Further, due to the absence of sharp corners and the characteristic energy distribution pattern, a μHRG has the potential to reach ultra-high Q.

Successful fabrication of μHRGs by conventional semiconductor fabrication processes would enable low-cost fabrication of integrated μHRGs. Additionally, by using such processes, μHRGs can be constructed using higher levels of system integration. Aspects of the present disclosure enable the creation of μHRGs having a low resonant frequency and ultra-high Q using foundry-compatible fabrication techniques. Some embodiments of the present disclosure satisfy requirements to operate in whole angle mode. Some embodiments of the present disclosure are also suitable for use in rate mode.

SUMMARY

Some embodiments of the present disclosure include a resonator assembly comprising a substrate having a first and a second side; a curved resonator body having a diameter of less than 3 mm; and a support stem connecting the resonator body to the first side of the substrate.

In some embodiments, the resonator body is made of a material selected from the group consisting of fused quartz, polysilicon, monocrystalline silicon, metallic materials, and mixtures thereof. In some embodiments, the curved resonator body is a hemisphere. In some embodiments, the curved resonator body comprises a flat disk and a curved rim. In some embodiments, the resonator assembly further comprises a ring attached to at least a portion of a perimeter of the resonator assembly. In some embodiments, the resonator assembly further comprises a DC contact on a surface of the resonator body. In some embodiments, the resonator assembly further comprises a DC contact on the second side of the substrate in electrical communication with the support stem. Some embodiments of the present disclosure include a microhemispherical gyroscope, comprising the resonator assembly of Claim 1, and a plurality of capacitive electrodes proximate to a circumference of the curved resonator body, each capacitive electrode of the plurality of capacitive electrodes an approximately equal distance from the curved resonator body of the resonator assembly.

Some embodiments of the present disclosure include a resonator assembly comprising a curved resonator body; a substrate having a first and a second side; a support stem having a first end and a second end, wherein the first end is attached to the substrate; and a levitation support having a first end and a second end, the first end attached to the curved resonator body, the second end attached to the second end of the support stem, and the support stem at least partially disposed within the levitation support. In some embodiments, the curved resonator body is a hemisphere. In some embodiments, the resonator assembly further comprises a ring attached to the curved resonator body. In some embodiments, the resonator assembly further comprises a metallic layer on a surface of the resonator body. In some embodiments, a portion of the metallic layer is eutectically bonded to the resonator body. Some embodiments of the present disclosure include a microhemispherical gyroscope, comprising the resonator assembly, and a plurality of capacitive electrodes proximate to a circumference of the curved resonator body, each capacitive electrode of the plurality of capacitive electrodes an approximately equal distance from the curved resonator body of the resonator assembly.

Some embodiments of the present disclosure include a method for making a microscale curved resonator comprising patterning a mold opening in a passivation layer on a first side of a substrate; etching a mold by performing an isotropic etch on the first side of the substrate; depositing a first sacrificial passivation layer on the first side of the substrate; depositing a resonator material on the first side of the substrate; depositing a second sacrificial passivation layer on the first side of the substrate; patterning an axisymmetric opening in the first and second sacrificial passivation layers on the first side of the substrate; etching a resonator cavity by performing an isotropic etch on the first side of the substrate; and dissolving at least a portion of the first and second sacrificial passivation layers to release a resonator body.

In some embodiments, the method further comprises patterning a back-side DC contact opening in a passivation layer on a second side of the substrate, wherein the contact opening is aligned with the center of the mold opening; and etching the back-side DC contact by performing an anisotropic etch on the second side of the substrate. In some embodiments, the method further comprises patterning a front-side DC contact opening in a passivation layer on the first side of the substrate, wherein the contact opening is aligned with the center of the mold opening; and etching the front-side DC contact by performing an anisotropic etch on the first side of the substrate. In some embodiments, the method further comprises patterning an electrode opening in a passivation layer on the first side of the substrate; etching an electrode trench by performing an anisotropic etch on the first side of the substrate; depositing a passivation layer in the electrode trench; and depositing a conductive electrode material in the electrode trench. In some embodiments, the step of patterning the electrode opening is performed simultaneously with the step of patterning the mold opening on the first side of substrate to create self-aligned electrodes.

Some embodiments of the present disclosure include a method for making a microscale curved resonator comprising patterning a support stem opening in a passivation layer on a first side of a substrate; etching a support stem trench by performing an anisotropic etch on the first side of the substrate; patterning a levitation support opening in a passivation layer on a first side of the substrate, wherein the second annular opening is larger than, and concentric with, the support stem trench; etching a levitation support trench by performing an anisotropic etch on the first side of the substrate; depositing a passivation material in the support stem trench and levitation support trench; patterning a mold opening in a passivation layer on the first side of the substrate, wherein the mold opening is larger than, and concentric with, the support stem trench and levitation support trench; etching a mold cavity by performing an isotropic etch on the first side of the substrate; removing any passivation layers from the surface of the first side of the substrate; depositing a first sacrificial passivation layer on the first side of the substrate; etching a support stem connector by anisotropically etching an opening, wherein the opening is smaller than, and concentric with, the support stem trench; depositing a resonator material on the first side of the substrate; depositing a second sacrificial passivation layer on the first side of the substrate; patterning an axisymmetric opening in the first and second sacrificial passivation layers on the first side of the substrate, wherein the axisymmetric opening is larger than, and concentric with the mold cavity; etching a resonator cavity by performing an isotropic etch on the first side of the substrate; and dissolving the remaining first and second sacrificial passivation layers to release a resonator body.

In some embodiments, the method further comprises patterning an electrode opening in a passivation layer on a first side of a substrate; etching an electrode trench by performing an anisotropic etch on the first side of the substrate; depositing a passivation layer in the electrode trench; and depositing a conductive electrode material in the electrode trench. In some embodiments, the step of patterning an electrode opening is performed simultaneously with the step of patterning a mold opening on a first side of substrate to create self-aligned electrodes.

Other aspects and features according to the present disclosure will become apparent to those of ordinary skill in the art, upon reviewing the following detailed description in conjunction with the accompanying figures.

BRIEF DESCRIPTION OF THE FIGURES

FIG. 3 depicts an embodiment of the present invention with a levitation support, mass loading rings, and a metal disk.

FIG. 4 depicts an embodiment of the present invention with a single levitation support and self-aligned electrodes.

FIGS. 29A-D illustrate a modification to the fabrication flow of FIGS. 24A-L to produce a resonator body with a front-side DC contact.

DETAILED DESCRIPTION

Figure 2:
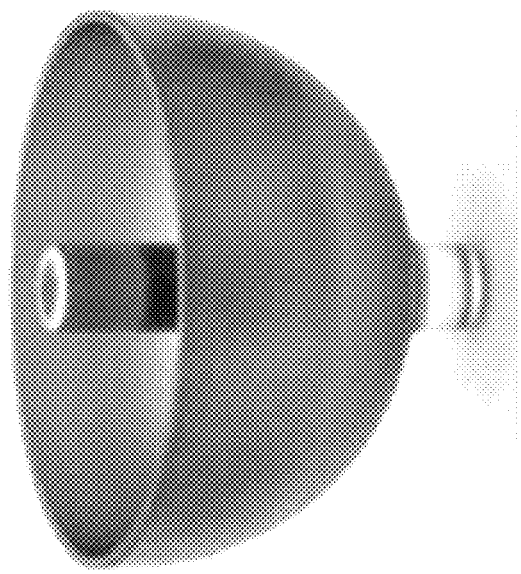
FIG. 2 depicts a prior art macro scale HRG resonator body.

Although preferred embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It should also be noted that, as used in the specification and the appended claims, the singular forms "a," "an" and "the" include plural references unless the context clearly dictates otherwise. References to a composition containing "a" constituent is intended to include other constituents in addition to the one named.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

The components described hereinafter as making up various elements of the invention are intended to be illustrative and not restrictive. Many suitable components that would perform the same or similar functions as the components described herein are intended to be embraced within the scope of the invention. Such other components not described herein can include, but are not limited to, for example, similar components that are developed after development of the presently disclosed subject matter.

To facilitate an understanding of the principles and features of the invention, various illustrative embodiments are explained below. In particular, the presently disclosed subject matter is described in the context of Coriolis vibratory gyroscopes (CVGs), and specifically micro-hemispherical resonator gyroscopes (μHRGs). The present invention, however, is not so limited, and can be applicable in other contexts. For example and not limitation, some embodiments of the present invention can be incorporated into oscillators, signal processing devices, and the like. These embodiments are contemplated within the scope of the present invention. Accordingly, when the present invention is described in the context of a hemispherical resonant gyroscope, it will be understood that other embodiments can take the place of those referred to.

Some embodiments of the present invention include a substrate. In some embodiments, the substrate is a material that can be used with conventional semiconductor device fabrication techniques. In some embodiments, the substrate can be a <001> or <111> monocrystalline Silicon (Si) wafer. In some embodiments, the substrate can comprise Diamond, Silicon (Si), Germanium (Ge), Silicon Carbide (SiC), Silicon-Germanium (SiGe), Silicon-on-Insulator, III-V Semiconductor (such as Gallium Arsenide (GaAs) or Gallium Nitride (GaN), or II-VI Semiconductors (such as CdSe, CdTe, CdHgTe, ZnS). In some embodiments, the substrate can be doped to create an n-Type or p-Type substrate. In some embodiments, the dopant can be a group II, III, IV, V, or VI element. In some embodiments, the substrate can be undoped.

Some embodiments of the present invention include an oxidation step of a silicon substrate. Such a step can be performed by various methods including thermal oxidation, electrochemical anodization, and plasma-enhanced chemical vapor deposition (PECVD). As is appreciated by a person having ordinary skill in the art, other oxidation methods can be used without departing from the scope of the present disclosure. Further, in some embodiments, the oxidation step can be substituted for a passivation step using another method. For example, passivation methods for silicon substrates can include depositing or growing a layer of silicon nitride, silicon dioxide, or titanium dioxide. As is understood by a person having ordinary skill in the art, other passivation methods can be used, including others for silicon substrates, and corresponding passivation methods for other types of substrates as is known in the art.

Some embodiments of the present invention include a patterning step. Patterning can be performed by lithographic processes known in the art, including processes that involve coating a substrate with a photoresist, and exposing the photoresist to UV light through a mask. Patterning can be accomplished using either projection or contact methods.

Some embodiments of the present invention include an etching step. Etching can be performed by processes known in the art. Some embodiments can be etched using dry etching processes, such as plasma etching. Where plasma etching processes are used, the etchant can be $CF_4$, $SF_6$, $XeF_2$, $NF_3Cl_2CCl_2F_2$, and the like. Some embodiments can be manufactured using wet etching processes. Where wet etching processes are used, the etchant can be $HNO_3$, HF, KOH, EDP, TMAH, HNA solution (HF:Nitric:Acetic) and the like. In some embodiments, etching processes can be isotropic. In some embodiments, etching processes can be anisotropic. In some embodiments, anisotropic etching is accomplished by Deep Reactive Ion Etching (DRIE) methods, such as the BOSCH process.

Some embodiments of the present invention include a deposition step of various materials. Deposition can be performed by processes known in the art. Some embodiments can include the deposition of materials by chemical vapor deposition. Some embodiments can include the deposition of materials by physical vapor deposition (PVD), such as cathodic arc deposition, electron beam PVD, evaporative PVD, pulsed-laser deposition, and sputter deposition. In some embodiments, deposition is performed by molecular beam epitaxy.

Figure 1:
FIG. 1 depicts a prior art macro scale hemispherical resonating gyroscope (HRG) (Northrop Grumman 130P HRG).

FIG. 1 depicts a conventional Hemispherical Resonator Gyro (HRG), which includes a precision-machined, highly symmetric hemispherical shell resonator made of an ultra-high-Q material, such as fused quartz, with manually-assembled and fine-tuned electrodes. A magnified view of the resonator body of a hemispherical shell resonator (HSR) is illustrated in FIG. 2. The conventional 130P HRG has a case diameter of 2.2 in, weighs 0.64 lb, and contains 64 separate parts. This HRG achieves a bias stability smaller than 0.0005°/hr. The smallest conventional HRG manufactured to date has case diameter of 1.4 in, weighs 0.25 lb, and contains only 5 separate parts. These devices have a bias stability of 0.00035°/hr.

FIGS. 3 and 4 depict a virtually-levitated embodiment of a μHRG resonator assembly. In some embodiments, a resonator assembly 100 can comprise a resonator body 101, a support stem 102, and a substrate 103. In some embodiments, a resonator assembly 100 can further comprise a levitation support 104. In some embodiments, a resonator assembly can further comprise one or more mass-loading elements, such as one or more rings 105. In some embodiments, a resonator assembly can further comprise a metal disk 107, connected to the top of the levitation support 104. In some embodiments, a resonator assembly can further comprise one or more electrodes 106.

Theory of Operation

Figure 5:
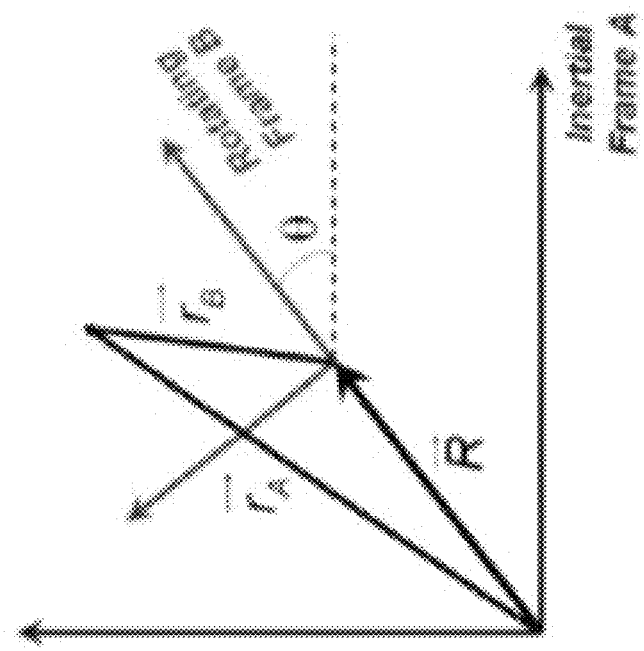
FIG. 5 is a graph of the Coriolis force caused by rotating frame B in inertial frame A.

These devices operate by sensing the effects of the Coriolis force on a vibrating resonator. The Coriolis force is a fictitious force that acts on moving objects when it is viewed in a rotating reference frame. As shown in FIG. 5, assuming inertial frame A and rotating frame B, the absolute acceleration of a point mass in A can be expressed as follows:

$$\vec{a} = \vec{A} + \vec{a_b} + \vec{\Omega} \times \vec{r_b} + \vec{\Omega} \times (\vec{\Omega} \times \vec{r_b}) + 2\vec{\Omega} \times \vec{v_b} \quad (1)$$

The absolute acceleration of a point mass in inertial frame A can be decomposed into: a linear acceleration of rotating frame B in static frame A ($\vec{A}$), linear acceleration of the point mass in frame B ($\vec{a_b}$), rotation acceleration ($\vec{\Omega} \times \vec{r_b}$), Centrifugal acceleration ($\vec{\Omega} \times (\vec{\Omega} \times \vec{r_b})$), and Coriolis acceleration ($2\vec{\Omega} \times \vec{v_b}$). Thus, Equation 1 shows that an observer standing in the rotating frame should observe a force whose direction is perpendicular to the angular velocity and relative velocity of the object with respect to the rotating frame.

Figure 6:
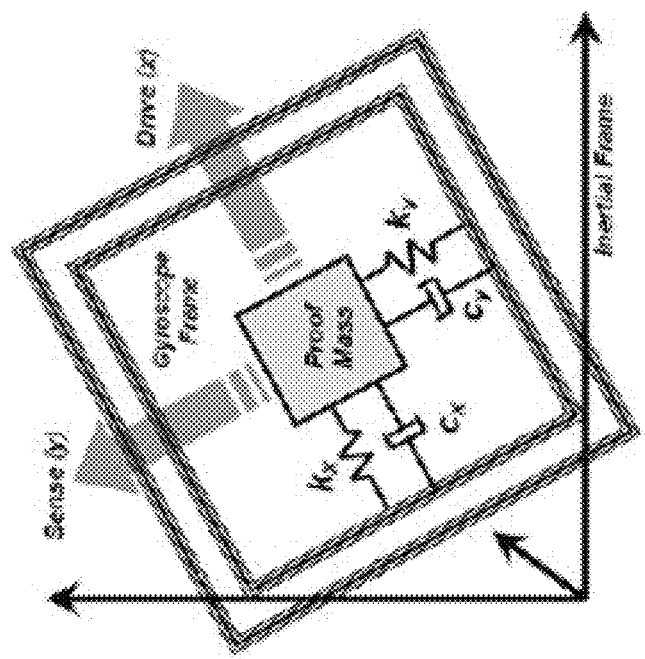
FIG. 6 is a graph of a lumped-element model of a Coriolis Vibratory Gyroscope (CVG).

FIG. 6 illustrates a lumped parameter model of a single proof-mass Coriolis vibratory gyroscope. In theory, it is a simplified two degree of freedom mass-spring-damper system. The proof-mass is supported by two spring and damper sets in two orthogonal directions. The device initially is driven into resonance along a drive axis, such as the x direction. When there is an out-of-plane angular rotation, the proof mass is displaced in the y direction. Sensors oriented along the y direction will detect displacement, and can be used to calculate the rotation of the device. CVGs generally have two modes of operation: rate mode and whole angle mode.

Rate Mode Operation

In rate mode, the signal output by the device is the angular velocity of the device. The Coriolis force generates a displacement along sense axis, which can be used to detect rotation. The dynamics of the mass can be described by the following differential equations:

$$\begin{cases} m\ddot{x} + C_x\dot{x} + k_x x = F_0 \sin \omega_n t \\ m\ddot{y} + C_y\dot{y} - 2m\Omega\dot{x} + k_y y = 0 \\ x(0) = \dot{x}(0) = y(0) = \dot{y}(0) = 0 \end{cases} \quad (2)$$

Figure 7:
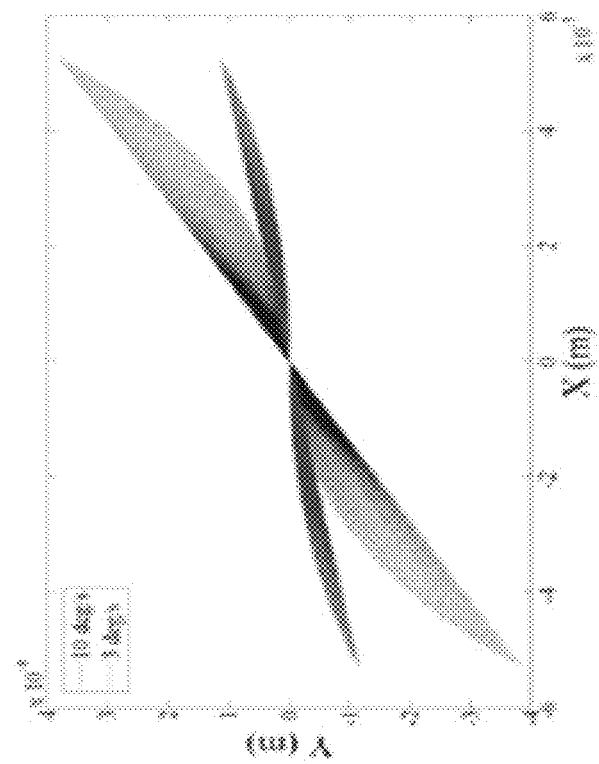
FIG. 7 is a graph of the dynamics of a CVG operating in rate mode.

Equation 2 assumes that the drive direction and sense direction have the same resonance frequency. In other words, the CVG is operated in a mode-matched condition. In Equation 2, the term $F_0 \sin \omega_n t$ is the sinusoidal drive force, and $2m\Omega\dot{x}$ is the Coriolis coupling term from x axis to y axis. All initial conditions are set to zero. By solving the system of differential equations, the dynamics of the proof-mass in the response of 3°/s and 10°/s angular rate are plotted respectively in FIG. 7. The sensed oscillations in the sense direction are thus proportional to angular velocity. For this reason, the output signal must be integrated over time to determine angular position. Additionally, the system requires finite time to respond and stabilize. Therefore, the dynamic range of this type of gyroscope is limited by the system bandwidth.

Whole Angle Mode Operation

Another mode of operation is whole angle mode, or rate integrating mode. In this mode of operation, the proof-mass is given an impulse and allowed to vibrate freely. The Coriolis force causes the vibration to precess. In this mode, the dynamics of the mass can be described by the following differential equations:

$$\begin{cases} m\ddot{x} + C_x\dot{x} + k_x x - 2m\Omega\dot{y} = 0 \\ m\ddot{y} + C_y\dot{y} + k_y y - 2m\Omega\dot{x} = 0 \\ x(0) = A, \dot{x}(0) = y(0) = \dot{y}(0) = 0 \end{cases} \quad (3)$$

Figure 8:
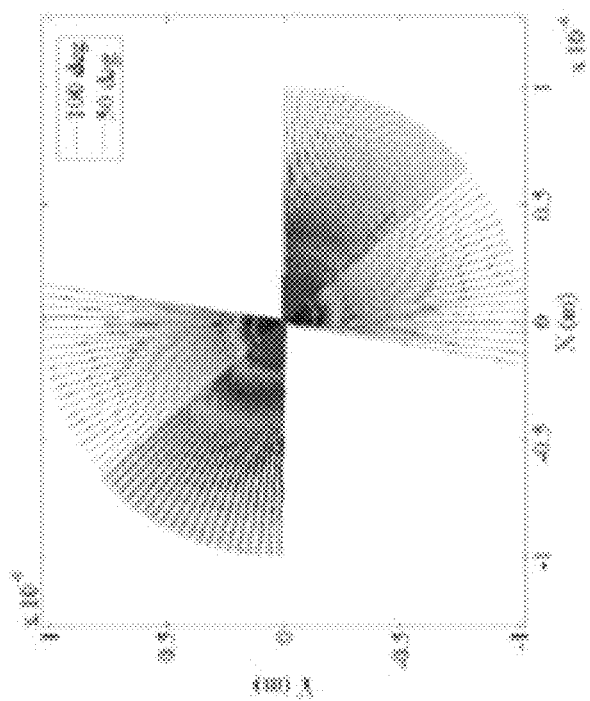
FIG. 8 is a graph of the dynamics of a CVG operating in whole angle mode.

As seen in Equation 3, the Coriolis coupling term is in the equations for both the x and y directions. At t=0, the mass is given a finite drive amplitude and zero velocity. Following the initial drive amplitude, no additional external forces act on the system. Rate integrating gyroscopes (RIG) usually have a high mechanical quality factor of resonance. Thus, the damping term is negligible. FIG. 8 illustrates the dynamics of a rate integrating mode gyroscope in response of 50° and 100° rotation. The angle the mass rotates is proportional to the angle that the system rotates, and can be directly determined from the instantaneous position and velocity by Equation 4. Because the output is directly proportional to the angle of rotation, no integration error is introduced, and dynamic range is not limited by the system bandwidth.

$$\tan 2\phi = \frac{2(\omega_n^2 xy + \dot{x}\dot{y})}{\omega_n^2(x^2 - y^2 + (\dot{x}^2 - \dot{y}^2))} \quad (4)$$

Figure 9:
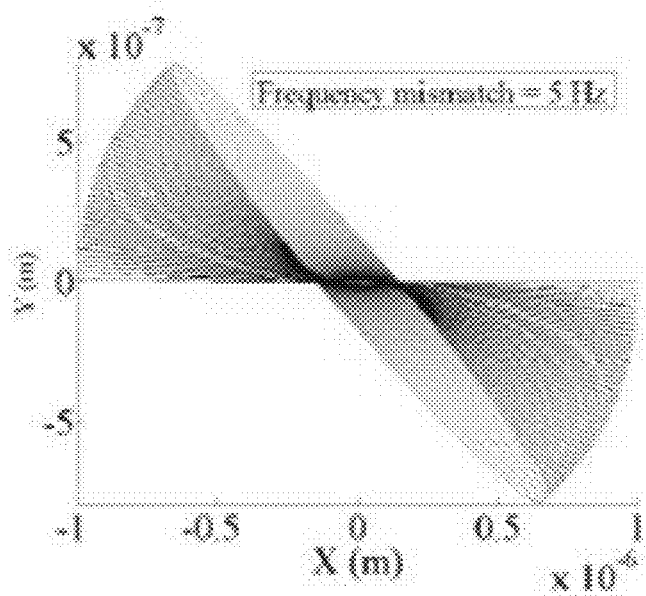
FIG. 9 is a graph of the effects of a frequency mismatch between the drive and sense axes of a CVG.

To take advantage of the benefits of rate integrating operation, gyroscopes must satisfy stringent performance requirements that are advantageously met and exceeded by the present invention. First, because no additional energy is added to the system after the initial drive signal, the resonator must have a high ring down time. This requires a low resonant frequency and high quality factor. Second, it requires a highly isotropic oscillator, such that the resonant frequency of the resonator does not significantly vary as the vibration precesses. This typically requires an axisymmetric resonator. Additionally, because of the heightened performance requirements for whole angle mode operation, resonators suitable for whole angle mode operation are also suitable for rate mode operation. FIG. 9 shows the dynamics of a RIG where there is a finite resonant frequency mismatch across a resonator in two orthogonal directions. The elliptical shape trajectory causes a large quadrature error as the vibration precesses.

Quality Factor

The quality factor (Q) of a µHRG is determined by the ratio of the maximum stored energy to the dissipated portion in a cycle, which can be caused by various physical phenomena.

$$Q = 2\pi \frac{\text{Energy Stored}}{\text{Energy Dissipated per Cycle}} \quad (5)$$

A higher quality factor always corresponds to a higher sensitivity and a lower mechanical noise. Moreover, a higher Q translates into a longer resonance ring-down, an important metric for resonators used in whole angle mode.

The known energy loss mechanisms in a µHRG include air damping, support loss, thermoelastic damping, surface scattering, interfacial friction, grain boundaries, crystal defects, phonon-phonon scattering, and phonon-electron scattering in metals. Air damping occurs when the resonator operates in a gaseous environment and can be eliminated through vacuum packaging of the structure. Support loss is the loss of energy from the device to the surroundings through vibration of the supporting structure. Thermoelastic damping (TED) is a source of intrinsic material damping due to the thermoelasticity of the material. Surface loss, interfacial friction, grain boundary scattering and defect scattering share many common features. Surface loss occurs due to roughness of the free surface of the material and is due mainly to inelastic phonon scattering at the surface. Interfacial scattering occurs due to imperfect boundaries and lattice mismatches at the interface between two materials. Grain boundary and defect scattering are additional phonon scattering mechanisms that depend on grain size in polysilicon and defect density, respectively.

Support Loss

Support loss is the vibration energy of a resonator dissipated by transmission through its support. During vibration, the hemispherical shell resonator has both vibrating shear force and moment on its support structure. These forces can act as excitation sources, exciting elastic waves that propagate into the support. This mechanism causes energy to dissipate through the support structure and into the substrate 103.

Figure 10:
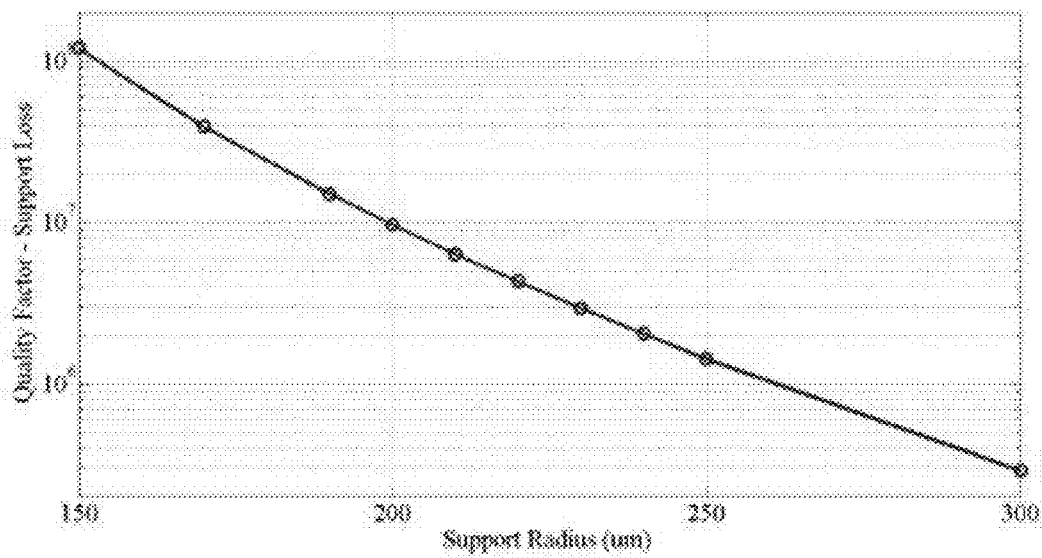
FIG. 10 is a graph of the quality factor of a resonator as a function of support stem radius.
Figure 11:
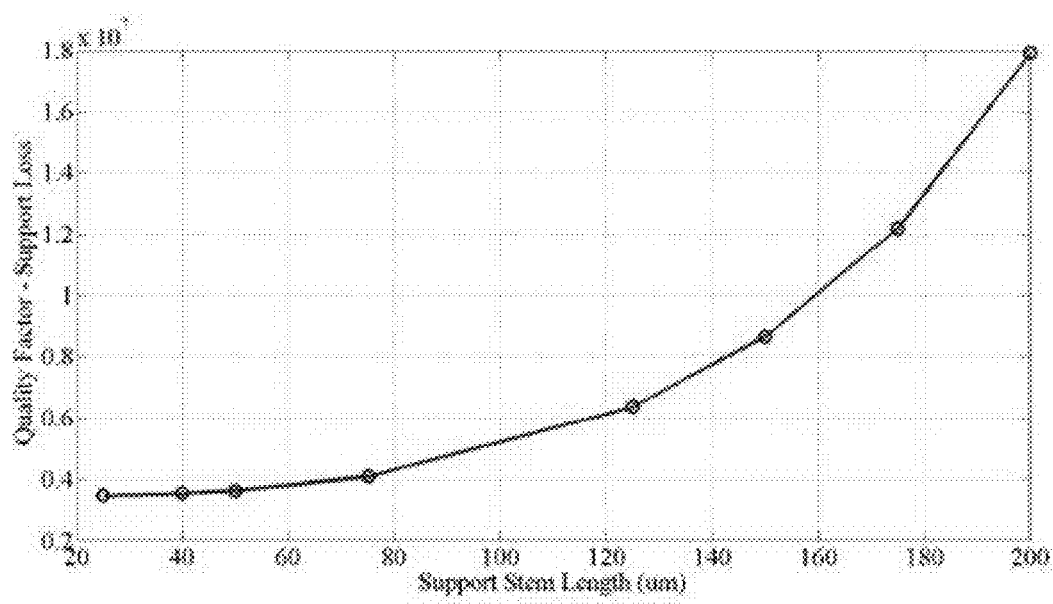
FIG. 11 is a graph of the quality factor of a resonator as a function of support stem length.

FIG. 10 shows quality factor as a function of support radius. Quality factor reduces from 100,000,000 to 200,000 as the support radius increases from 150 µm to 300 µm. Thus a smaller support typically yields a higher quality factor. In order to further isolate acoustic energy and the substrate 103 (which is an energy sink), the structure can be elevated by a long supporting stem. FIG. 11 shows the trend of quality factor as a function of support stem length. Increasing the stem length from 20 µm to 200 µm increases the quality factor by almost an order of magnitude.

One efficient method to enhance the quality factor of a resonator is to decouple the resonator from the substrate 103. In some embodiments, this is accomplished by attaching the resonator to the substrate 103 by a support stem 102 through which the structure is attached to the substrate 103. In some embodiments, the support stem can be a hollow cylinder at the center of the resonator body 101. Although physical levitation of the structure is the utmost form of decoupling from a substrate 103, pushing the energy concentration away from the anchoring location is accomplished more easily. If the structure is designed in such a way that the energy distribution of the resonant mode is concentrated in areas far from anchoring location(s), a smaller portion of energy in each cycle is prone to be transferred to substrate 103 and lost.

Figure 12:
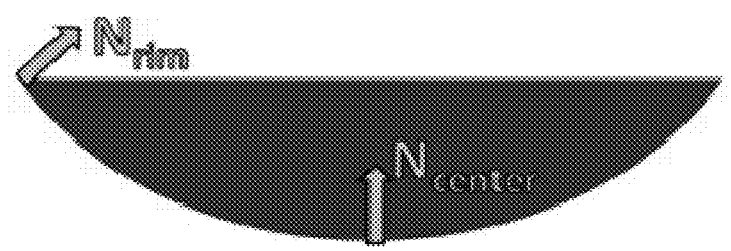
FIG. 12 illustrates the curvature angle of a resonator body.
Figure 13:
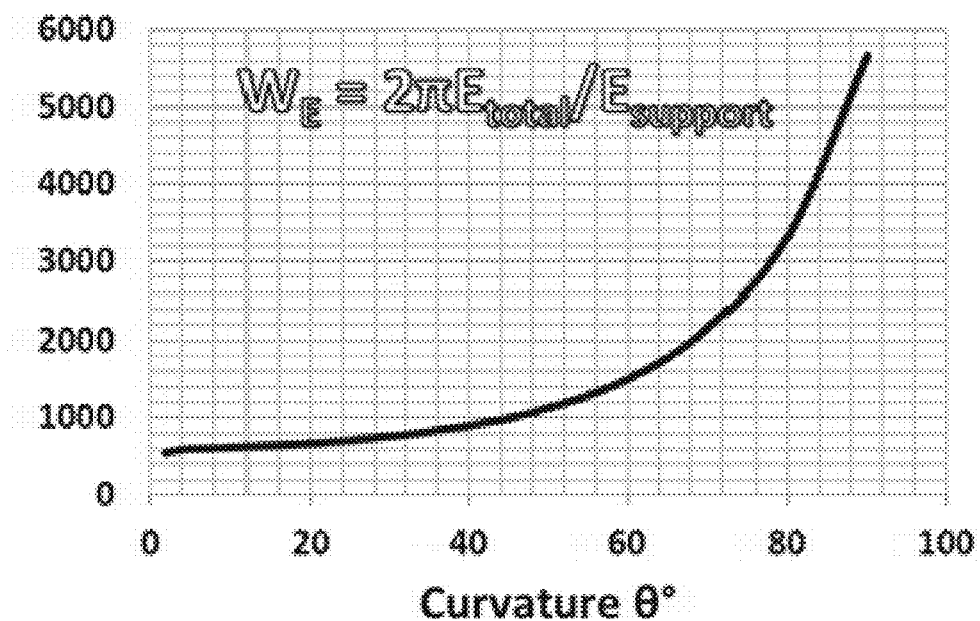
FIG. 13 is a graph of the minimum support quality factor of a resonator body as a function of curvature.

FIG. 12 illustrates a measurement of the curvature of a resonator body 101 as the angle between a vector normal to the surface at the rim and at the center of the resonator body 101. By this definition, a flat disc has an angle of 0° and a perfect hemisphere has an angle of 90°. The graph shown in FIG. 13 shows the minimum support quality factor as a function of curvature θ for a polysilicon resonator body 101 with a top diameter of 500 µm, thickness of 1 µm and support diameter of 50 µm (approximately a tenth of the resonator body diameter). This graph shows how the energy concentration on top of the anchored area decreases as the curvature increases from a flat disc to a hemisphere.

Figure 14:
FIG. 14 illustrates the profile of a resonator body in accordance with an embodiment, having a flat disk at the center.
Figures 15A, 15B, 15C:
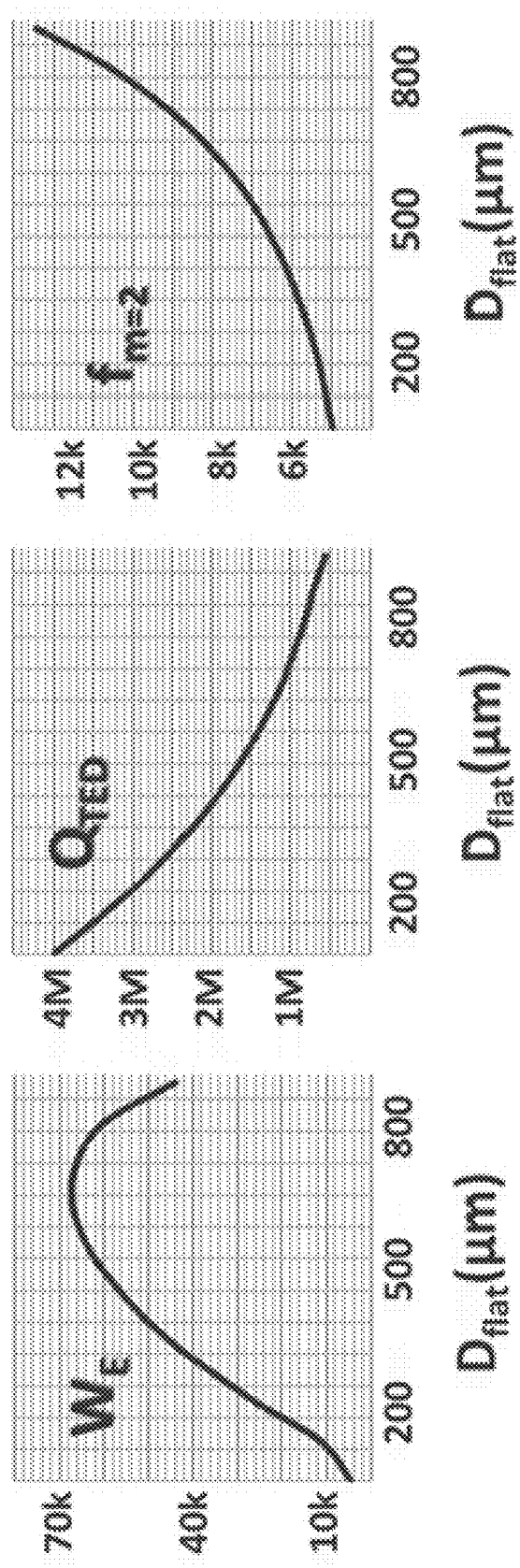
FIG. 15A is a graph of the minimum support energy loss as a function of the diameter of the flat disk of some embodiments.
FIG. 15B is a graph of the energy loss due to thermoelastic damping as a function of the diameter of the flat disk of some embodiments.
FIG. 15C is a graph of the resonant frequency as a function of the diameter of the flat disk of some embodiments.

The structure of the resonator body 101 plays a crucial role in the degree of coupling between the mode and substrate 103. In some embodiments, the resonator body 101 has a curved surface and a flat base, as shown in FIG. 14. The energy ratio of such a structure with a diameter of 1.2 mm, shell thickness of 1 µm and a support diameter of 120 µm is illustrated in FIG. 15A. The flat area has an improving effect on support energy loss, but tends to degrade thermoelastic damping and increases the resonant frequency, as illustrated in FIGS. 15A-C.

Figure 16:
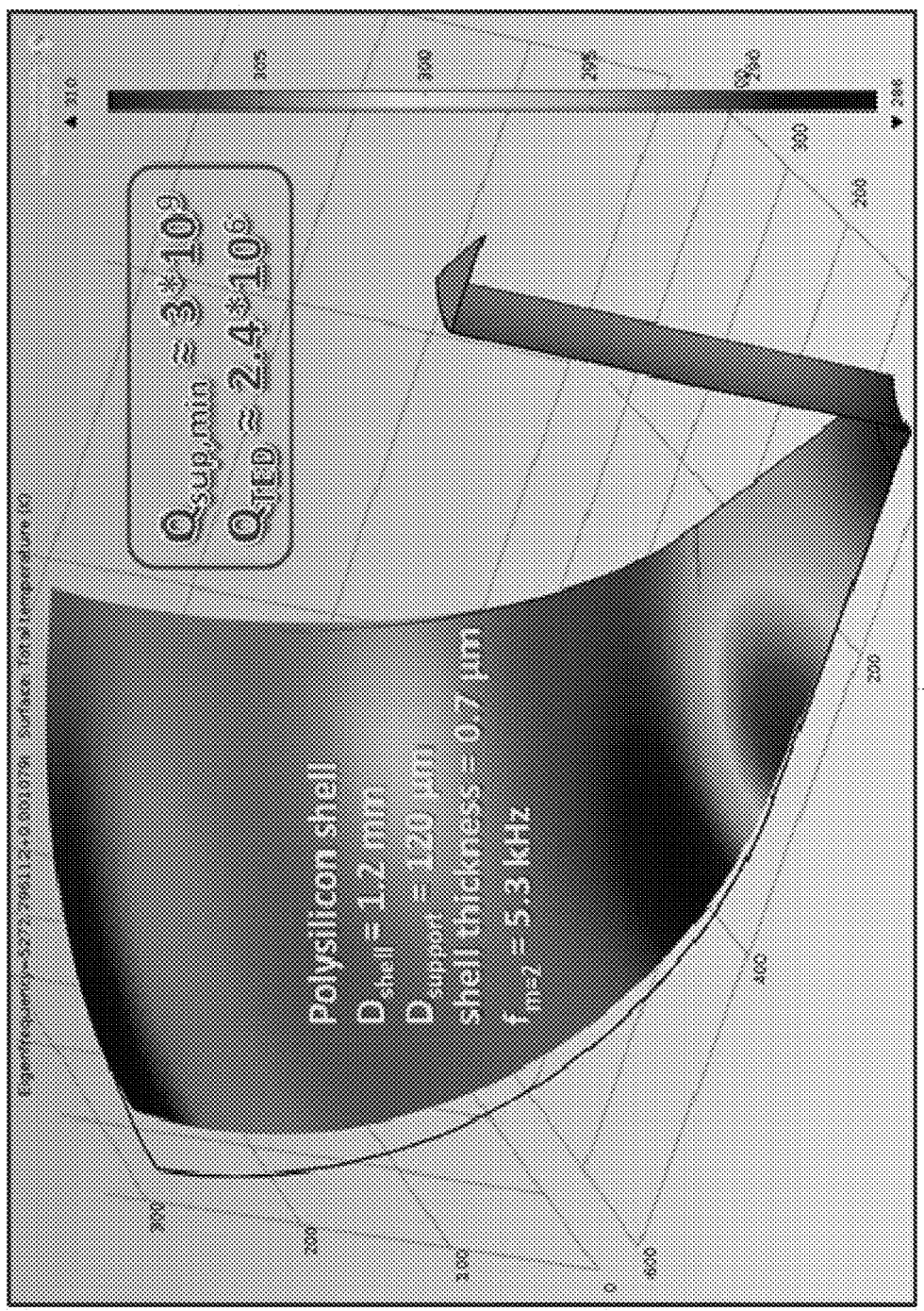
FIG. 16 depicts the temperature profile of a virtually levitated shell resonator.

In some embodiments, the resonator body 101 can be further decoupled from the substrate 103 by adding a levitation support 104 at the center of the resonator body, and anchoring the resonator body 101 to the substrate 103 by a support stem 102 attached to the top surface of the levitation support. The levitation support 104 creates an excessively large acoustic mismatch between the support stem and resonator body, allowing only an exceedingly small portion of the energy to reach the top surface of the levitation support. As an example, a finite element analysis gives a support energy ratio of $3 \times 10^9$ at the wineglass mode resonance frequency of 5.3 kHz for a polysilicon shell with a diameter of 1.2 mm, thickness of 0.7 µm, and a support diameter of 120 µm. As shown in FIG. 16, the virtually levitated shell resonator temperature profile results in a $Q_{TED} \sim 2.4 \times 10^6$ for the wineglass n=2 mode which translates into ring-down time of 144 seconds. This ring-down time can be further enhanced through parameter design; for example, smaller shell thicknesses increase the $Q_{TED}$ and ring-down time. While <1 0 0> substrates can be used, usage of substrates with <1 1 1> crystal orientation significantly reduces the frequency mismatch. Furthermore, an optimized wet isotropic etching on <1 1 1> substrates can result in sub-Hz frequency mismatch of the two degenerate wineglass m=2 modes.

Resonator Assembly

Figure 17:
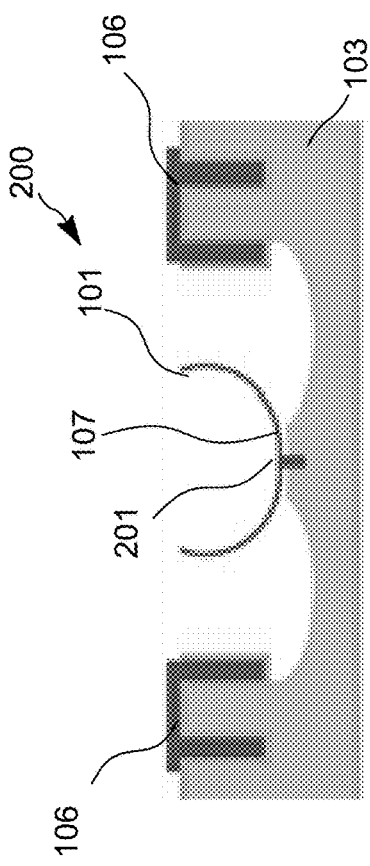
FIG. 17 illustrates an embodiment with a front-side DC contact.

In some embodiments, the resonator body 101 can comprise a curved axisymmetric structure. In some embodiments, the resonator body 101 is a hemispheric shell. In some embodiments, the resonator body 101 is a portion of a spherical shell, wherein the portion is defined by a curvature angle, measured as the angle between a vector normal to the center of the spherical shell and the vector normal to the rim of the resonator body, as shown in FIG. 17. In some embodiments, where the curvature angle is 90 degrees, the resonator is a hemisphere. In some embodiments, the curvature angle can range from approximately zero degrees to approximately 180 degrees. In some embodiments, the resonator body 101 can comprise various other axis-symmetric shapes, such as a portion of a paraboloid, or other shells defined by a profile rotated about an axis. In some embodiments, the resonator body 101 has an average thickness of about 2 µm. In some embodiments, the resonator body 101 can have a thickness of about 700 nm to 3 µm. In some embodiments, the resonator body 101 can have a thickness of about 500 nm to 10 µm.

In some embodiments, the resonator body 101 can comprise a flat base with a curved rim. The curved rim can have a profile corresponding to a portion of a circle, where the profile is defined by the intersection of the resonator body 101 and a plane containing the axis of symmetry. In some embodiments, the resonator body 101 can be fabricated from polysilicon, monocrystalline silicon, silicon dioxide, silicon nitride, fused quartz, or other materials known to persons having ordinary skill in the art as suitable for MEMS resonators. In some embodiments, the resonator body 101 can be fabricated from metallic materials, including nickel alloys such as Invar, Invar36, Super-Invar, and Elinvar.

In some embodiments, the resonator can comprise a mass-loading component. The mass-loading component is used to suppress the mechanical/Browninan noise of the resonator, which can contribute to angle measurement errors. The mass-loading component can comprise one or more mass-loading rings 105, which can comprise concentric rings 105, connected to the resonator body. Each mass-loading ring comprises a ring having a thickness of up to 200 µm, and a height of 1-10 µm.

In some embodiments, the resonator body 101 can be directly connected to a substrate 103. In some embodiments, the resonator body 101 can be connected to a substrate 103 via a support stem 102. The support stem 102 can be used to isolate a vibrating resonator body 101 from the substrate 103. In some embodiments, the support stem 102 is connected to the resonator body 101 at a point on, or in proximity to, the axis of symmetry. In some embodiments, the support stem 102 is symmetric about an axis. In some embodiments, the support stem 102 is symmetric about the same axis as the resonator body. In some embodiments, the stem can be a polygonal prism, such as a triangular prism or rectangular prism. In some embodiments, the support stem 102 can be hollow. In some embodiments, the thickness of the stem, measured as the area of the cross-section of the stem perpendicular to the axis of symmetry, is about one tenth the diameter of the resonator body.

Figure 18:
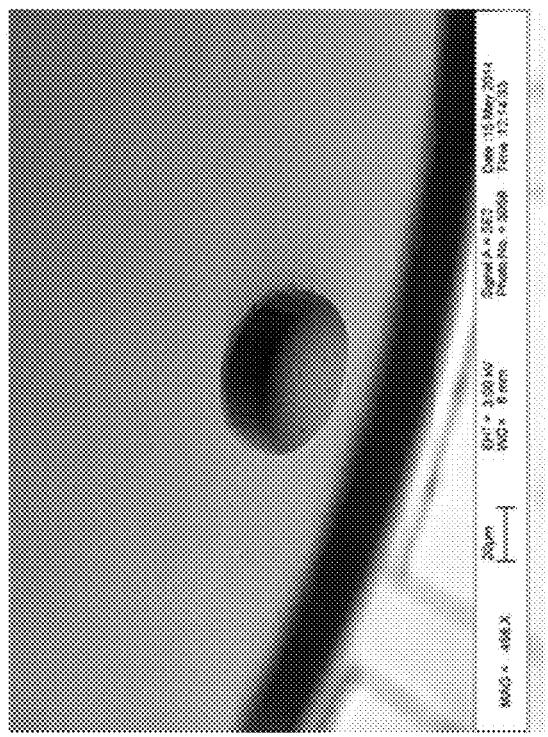
FIG. 18 is a micrograph of an embodiment with a front-side DC contact and self-aligned electrodes, showing the front-side DC contact.
Figure 20:
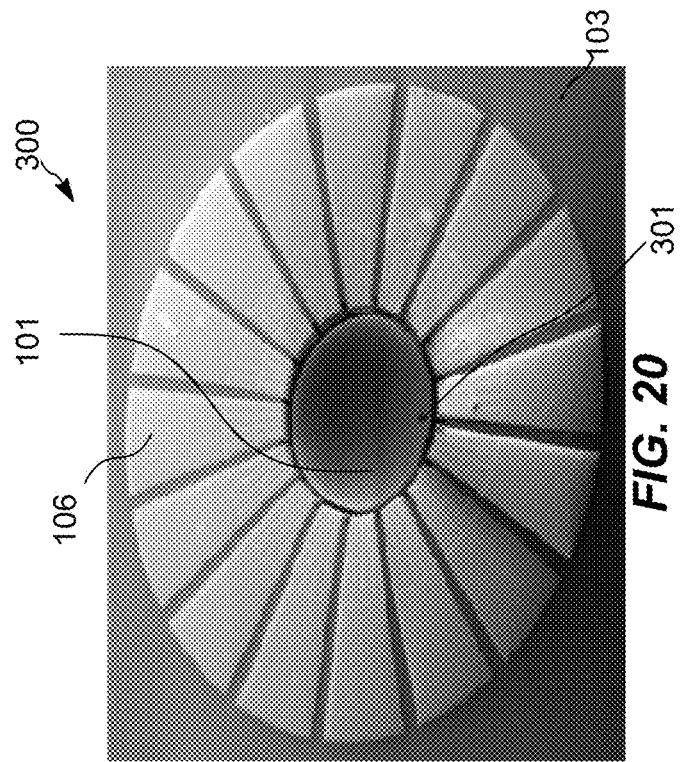
FIG. 20 is a micrograph of an embodiment with a back-side DC contact, and self-aligned electrodes.
Figure 19:
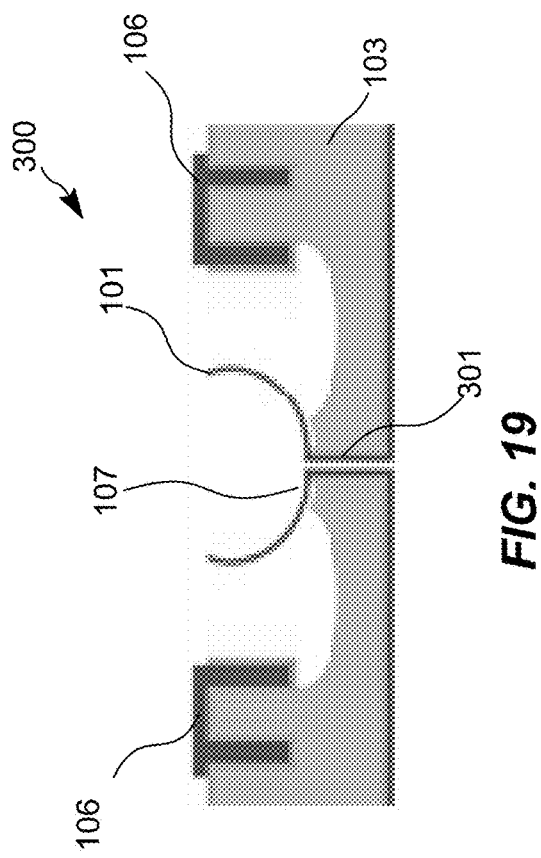
FIG. 19 illustrates an embodiment with a back-side DC contact.

In some embodiments, the support stem 102 can be made of the same material as the resonator body. In some embodiments, the support stem 102 can be fabricated as a single piece with the resonator body. In some embodiments, the support stem 102 can be fabricated as a separate piece, and then attached to the resonator body. In some embodiments, the support stem 102 can be fabricated from a different material from the resonator body. In some embodiments, the support stem 102 can be fabricated from polysilicon, monocrystalline silicon, silicon dioxide, fused quartz, or other materials that are known to persons having ordinary skill in the art In some embodiments, the resonator body 101 can comprise an electrical DC contact. In some embodiments, this DC contact is used to provide a bias voltage to the resonator body 101. In some embodiments, this contact can be located on the surface of the resonator body, such as in the center of the resonator body. FIG. 17 and FIG. 18 depict an embodiment having a front-side DC contact 201. In some embodiments, this DC contact can be located on the opposite side of the substrate 103 from the resonator body. FIG. 19 and FIG. 20 depict an embodiment having a back-side DC contact 301. In some embodiments, this contact can be located on the support stem 102 rather than the resonator body 101.

In some embodiments, the resonator body 101 can be directly connected to the support stem 102. In some embodiments, the resonator body 101 can be virtually levitated from the substrate 103 by connecting the resonator body 101 to the support stem 102 by one or more levitation supports 104. In some embodiments, a levitation support 104 is a hollow cylinder having a first and a second end. The first end can be connected to the center of the resonator body. The second end can be connected to the support stem 102. In some embodiments, the support stem 102 is at least partially enclosed by the levitation support 104. In some embodiments, the support stem 102 can extend through a hole in the center of the resonator body. As is understood by a person having ordinary skill in the art, the levitation support 104 need not be cylindrical, but can be another axis-symmetric or rotationally symmetric shapes.

In some embodiments, the resonator body 101 can be connected to a support stem 102 by a plurality of levitation supports 104. In some embodiments, each levitation support 104 in the plurality of levitation supports 104 can be coaxial. In some embodiments, the first end of the first levitation support 104 can be connected to the support stem 102, and the second end of the first levitation support 104 can be connected to the first end of the second levitation support 104. Where there are two levitation supports 104, the second end of the levitation support 104 can be connected to the resonator body. In some embodiments, a resonator body 101 can be connected to the support stem 102 with more than two levitation supports 104. The first end of the first levitation support 104 can be connected to the support stem 102, and the second end connected to the first intermediate levitation support 104. The first end of each intermediate levitation support 104 is connected to the second end of the subsequent levitation support 104, and the second end is connected to the first end of the next levitation support 104. The first end of the last levitation support 104 is connected to the first second end of the last intermediate levitation support 104, and the second end is connected to the resonator body.

In some embodiments, levitation supports 104 can be made of the same material as the resonator body. In some embodiments, levitation supports 104 can be fabricated as a single piece with the resonator body. In some embodiments, levitation supports 104 can be fabricated as a separate piece, and then attached to the resonator body. In some embodiments, levitation supports 104 can be fabricated from a different material from the resonator body. In some embodiments, levitation supports 104 can be fabricated from polysilicon, monocrystalline silicon, silicon dioxide, fused quartz, or other materials that are known to persons having ordinary skill in the art.

In some embodiments, the resonator body 101 can be surrounded with electrodes. The electrodes can be fabricated into the same substrate 103 connected to the resonator. In some embodiments, the distance from an electrode to the resonator body 101 forms a capacitive gap. In some embodiments, the capacitive gap is 1 µm-20 µm. In some embodiments, each electrode has a curved surface corresponding to the circumference of the resonator body. In some embodiments, each electrode corresponds to a particular circumferential span of the resonator body. In some embodiments, each electrode has a 20 degree circumferential span.

In some embodiments, the electrodes are self-aligned by patterning the electrodes in the same lithographic step as is used to create the mold opening for the resonator body. In some embodiments, the electrodes are equally-spaced around the resonator body. In some embodiments, sixteen electrodes can be spaced equally around the resonator body. As is understood by a person having ordinary skill in the art, any other configuration of electrodes could be used to operate the resonator body. In some embodiments, at least one electrode is aligned with a first vibration node, and a second electrode is aligned with a first vibration antinode of the resonator body. In some embodiments, the electrodes can comprise a polysilicon, doped polysilicon, metal, or other material known in the art for making electrodes.

In some embodiments, the resonator body 101 can operate in a vacuum. In some embodiments, the vacuum can have an atmospheric pressure between 100 µTorr and 1 mTorr. In some embodiments, the resonator body 101 can be sealed in a vacuum chamber, which maintains the vacuum.

In some embodiments, the resonator assembly can comprise a metallic layer 107, used to trim the resonance properties of the resonator body. As previously discussed, to operate a resonator assembly in RIG mode, the resonator body should be axisymmetric, with the two vibration modes matched. Although any axisymmetric resonator body theoretically meets the two required conditions, fabrication errors can shift the resonance frequencies apart and can misalign the two modes with respect to the electrodes. The fabrication errors can include minute tilting of the support stem, and deviations from a perfect axisymmetric resonator body.

Eutectic trimming can modify the stiffness of the resonator body, thereby modifying the resonator body's resonance properties. Eutectic trimming can be performed either over the entire resonating body or only at targeted locations using a variety of methods. In some embodiments, the eutectic trimming methods described in Hamelin, et al., *Localized Eutectic Trimming of Polysilicon Microhemispherical Resonating Gyroscopes*, 14 IEEE SENSORS J. 3498-505 (2014), the entirety of which is hereby incorporated by reference as if fully set forth herein. To perform eutectic trimming, a thin layer of metallic trimming material is deposited on a resonator surface. Then, the metallic material can be thermally forced to diffuse into the device to create eutectic bonds with the resonator body, modifying the stiffness of the resonator body. This heating can be accomplished with a directed energy source, such as a laser. In some embodiments, this method can be performed with resonator assemblies with or without a levitation support.

Where resonator bodies are fabricated from polysilicon, gold (Au) and aluminum (Al) can be used as metallic layers 107 for tuning. These materials are good candidates because the eutectic bonding temperature is lower than the melting temperature, and the eutectic compound formed has a different stiffness than polysilicon. In one non-limiting example, the combination of gold-silicon has a eutectic temperature of about 363° C., which is lower than gold's melting temperature of about 1063° C. Further, the Young's modulus of gold-silicon eutectic compound is higher than that of polysilicon. In another non-limiting example, aluminum-silicon has a eutectic temperature of about 577° C., which is lower than aluminum's melting temperature of 660° C. For aluminum-silicon, the eutectic compound has a reduced Young's modulus compared to silicon. As is understood by persons having ordinary skill in the art, other materials can be used to form a metallic layer 107 with polysilicon. Where resonator bodies are made from other materials, likewise a person having ordinary skill in the art would recognize corresponding materials capable of forming eutectic compounds with the resonator body to be used as a metallic layer 107.

Methods of Making

In some embodiments, the resonator assembly can be constructed using processes known in the art of semiconductor fabrication. These steps can include patterning steps, isotropic etching steps, and anisotropic etching steps. Various steps can be substituted for known equivalents in the art, including, but not limited to, the ones disclosed herein.

In some embodiments, a mold is fabricated prior to fabricating the resonator body. In some embodiments, the mold can be highly symmetric. In some embodiments, the mold can have a mirror-finish smooth surface. In some embodiments, the mold can be created in a two-step process. First, an oxide mask is patterned on the surface of a substrate 103, leaving the substrate 103 exposed in a circular region, constituting the mold opening. Second, an isotropic etching process is performed on the substrate 103. The isotropic nature of the etching process causes an axially symmetric cavity to form within the substrate 103, which constitutes the mold cavity. In some embodiments, the isotropic etching can be performed by wet etching or dry etching. In some embodiments, $SF_6$ plasma can be used to create a hemispherical mold. Isotropic etching with $SF_6$ plasma is a repeatable process with good mold symmetry and surface finishing, although other techniques could be used, as is appreciated by a person having ordinary skill in the art. In some embodiments, the mold cavity is hemispherical. In some embodiments, the mold cavity has a flat bottom and a curved edge. As is appreciated by one having ordinary skill in the art, a wide variety of mold cavity shapes can be formed by selection of the size and shape of the mold opening, etch method, and etch depth.

Figure 21:
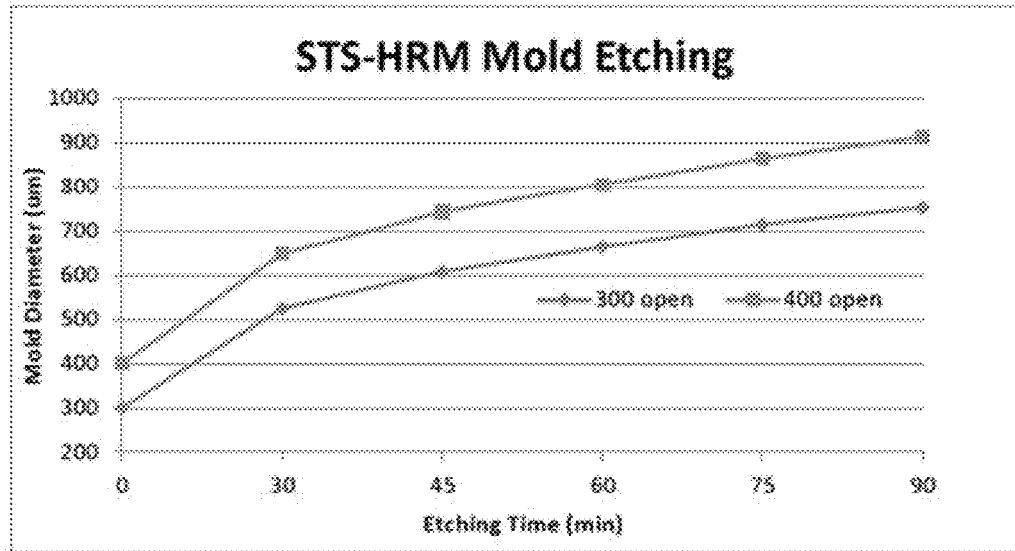
FIG. 21 is a graph of the mold cavity diameter as a function of etch time using an STS-HRM device.
Figure 22:
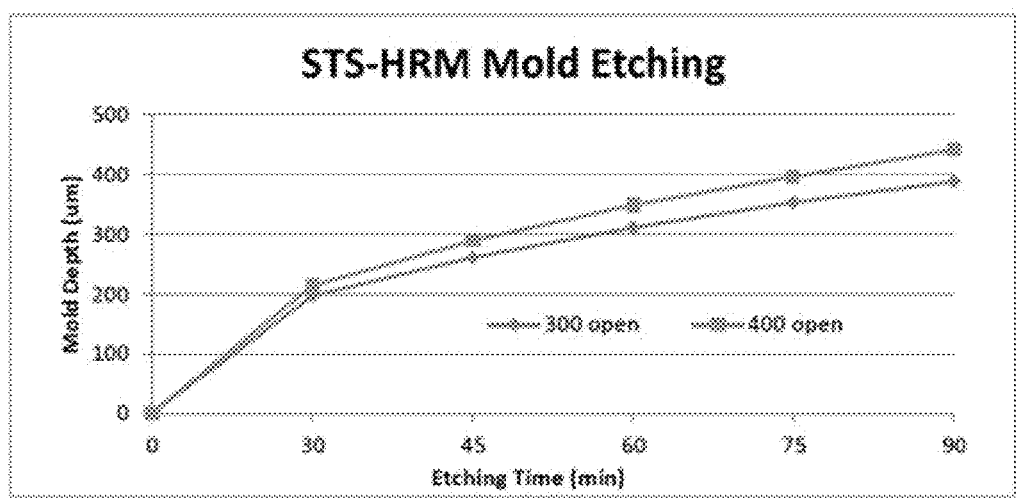
FIG. 22 is a graph of the mold cavity depth as a function of etch time using an STS-HRM device.
Figure 23:
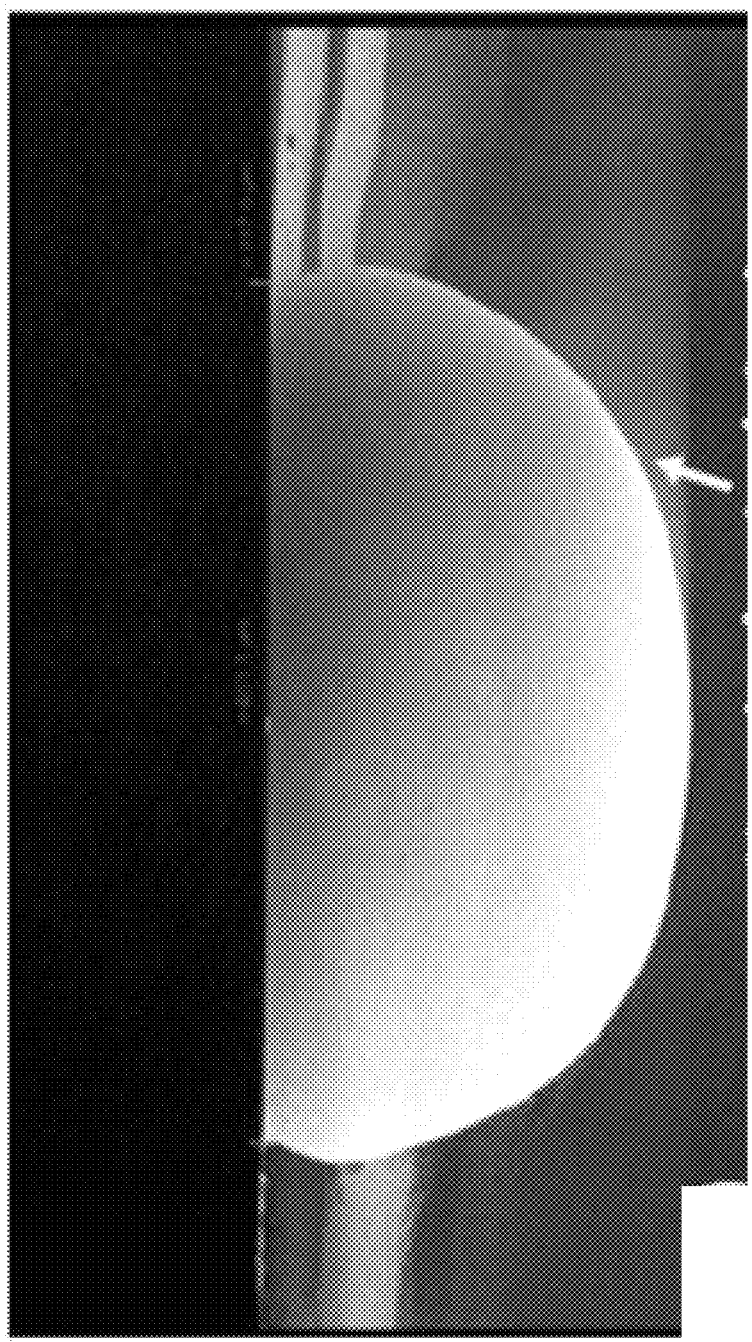
FIG. 23 is a micrograph of a hemispherical cavity in a substrate.

In some embodiments, isotropic etching of silicon can be performed with an Inductively Coupled Plasma (ICP) tool by turning off the passivation step of the BOSCH process. FIG. 21 shows the mold diameter as a function of etching time in STS HRM for initial circular openings of 300 μm and 400 μm, respectively. FIG. 22 shows the mold depth as a function of etching time in the same etching tool. FIG. 23 shows a hemispherical mold cavity etched in a silicon wafer.

In some embodiments, electrodes are fabricated with the resonator assembly. In these embodiments, the first patterning step can include one or more openings corresponding to one or more electrodes. By patterning the position of the resonator body 101 and the electrodes in the same mask, the two can be self-aligned. This self-alignment can minimize, if not eliminate, alignment errors. In some embodiments, following the formation of electrode openings, electrode trenches can be formed by anisotropically etching the first side of the substrate 103. In some embodiments, a passivation layer, such as an oxide layer, can be formed on the interior of the electrode trenches. In some embodiments, the electrodes can be formed by depositing an electrode material, such as polysilicon, in the electrode trenches. In some embodiments, the electrode material can contain a dopant.

Back-Side DC Contact

Figures 24A, 24B:
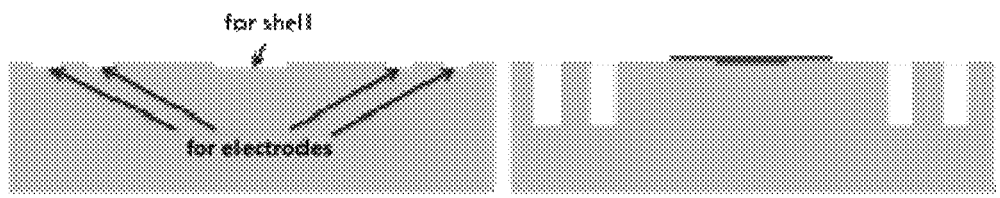
FIGS. 24A-L illustrates a fabrication flow for fabricating an embodiment with a back-side DC contact, and self-aligned electrodes.

In some embodiments, the resonator body 101 can be fabricated to comprise a back-side DC contact. FIG. 24A-L depicts a process flow for fabricating a resonator assembly with a back-side DC contact. In some embodiments, the first fabrication step, depicted in FIG. 24A, is to grow and pattern an oxide layer on both sides of the substrate 103. In some embodiments, the silicon dioxide layer can be grown to a thickness of approximately 6 μm. In some embodiments, this oxide layer is patterned to include a circular opening for the hemispherical mold, and openings for electrodes.

In some embodiments, the second fabrication step is to deposit and pattern a photoresist over the opening for the hemispherical mold, depicted in FIG. 24B. This photoresist protects the mold opening from the etching process to create the electrodes. In some embodiments, the trenches for electrodes are designed to be 8 μm wide and etched to 300 μm in depth, thus having an aspect-ratio of approximately 1:40. The second fabrication step further includes an anisotropic etching of the substrate 103 to create electrode trenches.

Figures 24C, 24D:
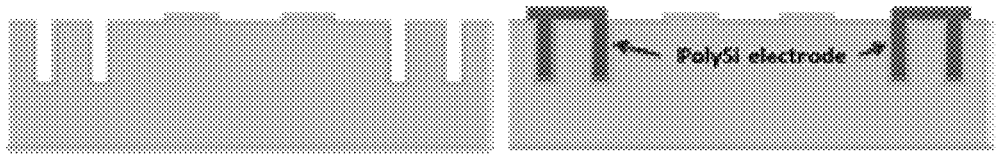

In some embodiments, the third step is to deposit a passivation layer on the substrate 103, shown in FIG. 24C. This passivation layer can insulate the electrodes from the substrate 103. In some embodiments, silicon nitride is deposited by Low-Pressure Chemical Vapor Deposition (LPCVD) to form a passivation layer to insulate the electrodes and the silicon substrate 103.

In some embodiments, the fourth step is to deposit an electrode material into the electrode trenches, illustrated in FIG. 24D. In some embodiments, this can be accomplished by LPCVD deposition of boron-doped polysilicon. In some embodiments, boron-doped polysilicon can be deposited in-situ by LPCVD at 588° C. to refill the trenches and form the electrode structure. As is appreciated by persons having ordinary skill in the art, other electrode materials can be deposited by other methods to form the electrodes.

Figures 24E, 24F:
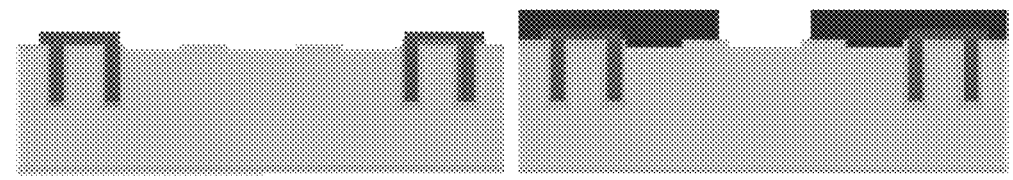

In some embodiments, the fifth step is to perform an etching step to remove passivation material deposited in the third step from the surface of the substrate 103. This step is illustrated in FIG. 24E. As is appreciated by a person having ordinary skill in the art, this step should not remove the passivation layer between the electrodes and the substrate 103.

In some embodiments, the sixth step is to pattern a photoresist material on the substrate 103, which exposes the mold opening, but protects the rest of the substrate 103. This step is illustrated in FIG. 24F. The photoresist should leave exposed a portion of the edges of the mold opening, such that the subsequent etch is defined by the mold opening formed in the first step, and not the photoresist.

Figures 24G, 24H:
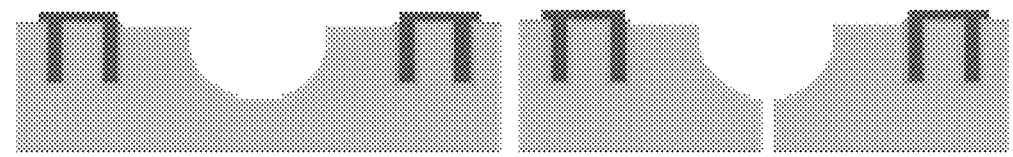

In some embodiments, the seventh step is to perform an isotropic etch on the substrate 103, as illustrated in FIG. 24G. The isotropic etch can be accomplished by $SF_6$ plasma, or other isotropic etching processes known in the art. This step will create a mold cavity in the substrate 103.

In some embodiments, the eighth step is to perform a high-aspect ratio etch in the back side of the substrate 103, aligned with the center of the resonator body. This step is illustrated in FIG. 24H. In some embodiments, this step creates a circle with a diameter of 40 μm, aligned with the center of the hemispherical mold on the second side of the substrate 103.

Figures 24I, 24J:
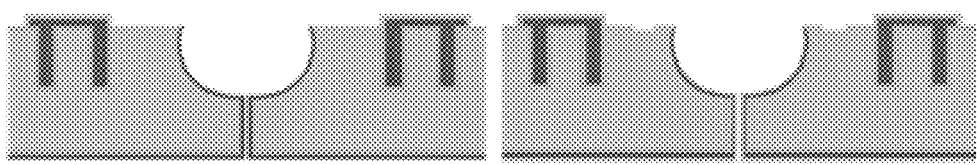

In some embodiments, the ninth step is to grow a first oxide layer on the first side of the substrate 103, and deposit a layer of polysilicon. This step is illustrated in FIG. 24I. In some embodiments, the sacrificial silicon dioxide layer is 2 μm thick. In some embodiments, polysilicon is then deposited by LPCVD to create the hemispherical resonator body, which is then doped and annealed at 1050° C.

In some embodiments, the tenth step is to grow a second oxide layer on the first side of the substrate 103, and pattern a release opening in the first and second oxide layers. This step is illustrated in FIG. 24J. The release opening can be an annulus concentric with the mold opening.

Figures 24K, 24L:
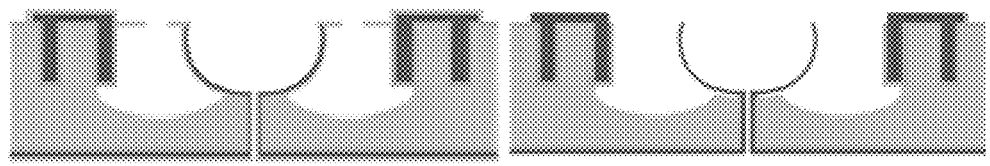

In some embodiments, the eleventh step is to perform an isotropic etch of the first side of the substrate 103, releasing the resonator body 101 from the substrate 103. This step is illustrated in FIG. 24K. In some embodiments, photoresist is applied by spray-coating. During the device releasing procedure, DRIE dry release is performed followed by isotropic silicon etching in $XeF_2$ gas. This step can clear out the silicon between the resonator body 101 and the electrodes, and forms a capacitive air gap. The DRIE dry release reduces the amount of isotropic etching, and thus reduces the undercut to the electrode structure.

In some embodiments, the twelfth step is to remove the first and second oxide layers from the substrate 103. This step is illustrated in FIG. 24L. This stem can be performed by a wet HF release. In some embodiments, super critical drying is used to dry the released devices.

Figures 25, 26:
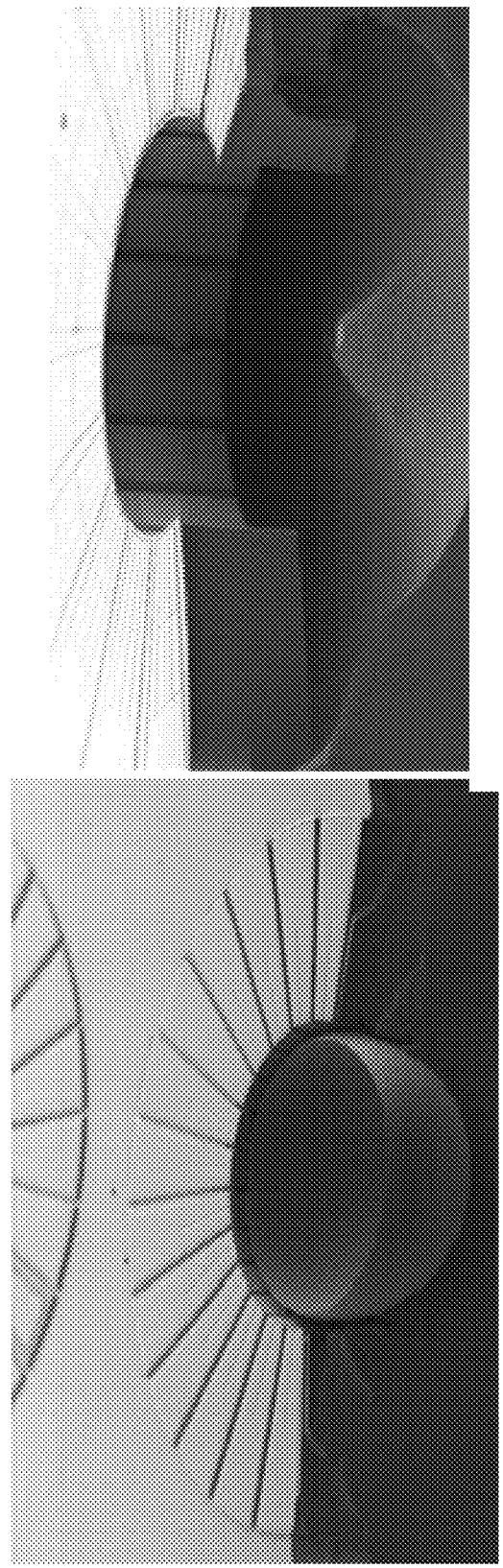
FIG. 25 illustrates a cross-section of an embodiment with a back-side DC contact, and self aligned electrodes, showing the resonator body in detail.
FIG. 26 illustrates an embodiment with a back-side DC contact, and self aligned electrodes, with the resonator body removed.
Figures 27, 28:
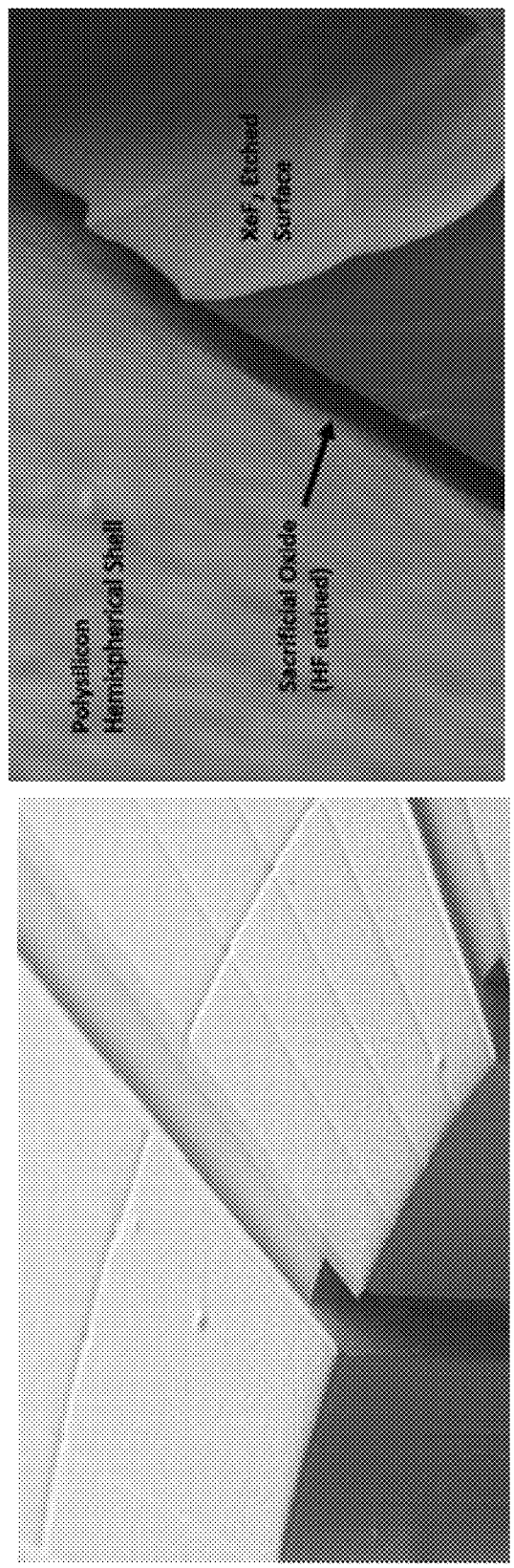
FIG. 27 illustrates details of electrodes in accordance with some embodiments.
FIG. 28 illustrates the separation of the resonator body from the substrate caused by removing a sacrificial oxide layer.

FIG. 25 shows an embodiment of a polysilicon μHRG with 16 self-aligned polysilicon electrodes and through hole for DC bias. FIG. 26 illustrates a cross sectional view of the polysilicon µHRG of FIG. 25. FIG. 26 illustrates a cross sectional view of the polysilicon µHRG of FIG. 20 with the resonator body 101 removed. FIG. 27 is a micrograph of the polysilicon electrodes. FIG. 28 is a highly magnified view of a released hemispherical resonator body, showing the sacrificial silicon dioxide etched during the HF release process.

Front-Side DC Contact

In some embodiments, a resonator assembly can be fabricated with a front side DC contact. This process can eliminate the backside alignment and through hole by using a front side pattern of spray-coated photoresist.

Figure 30:
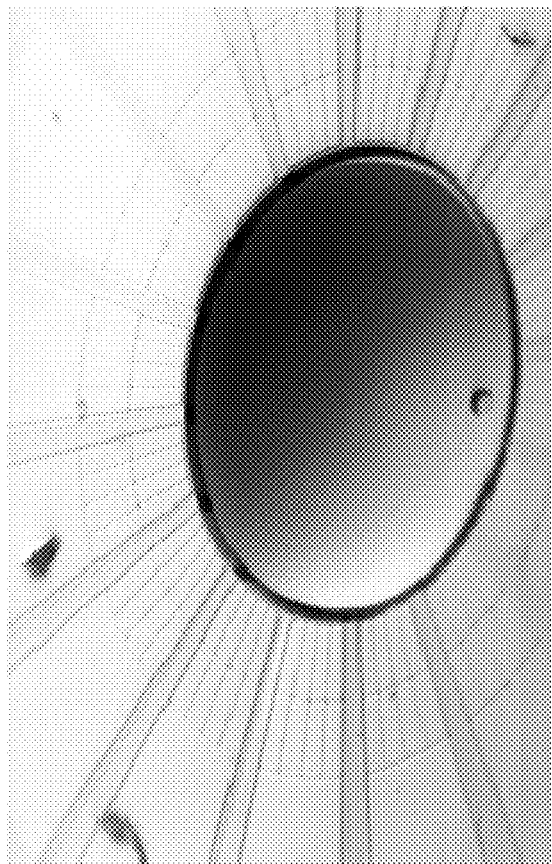
FIG. 30 illustrates an embodiment with a front-side DC contact and self-aligned electrodes.

The beginning of the process can be the same as the process introduced previously, including the isotropic etch of the curved mold, depicted in FIG. 29A. Fabrication step eight, which creates the back-side contact, is not performed. Instead, after growing the sacrificial oxide layer, a circle is patterned in the center of the resonator body. After photoresist development, the exposed sacrificial oxide is etched and the silicon underneath is also etched by DRIE as shown in FIG. 29B. The polysilicon structural layer is then deposited, doped and annealed, as shown in FIG. 29C. The rest of the process flow remains the same as the previous process. The final structure is shown in FIG. 29D. FIG. 30 shows a SEM image of a fabricated polysilicon µHRG with a front side DC contact. A front side DC contact is shown in FIG. 18.

Levitation Supports

In some embodiments, a resonator assembly can be constructed with one or more levitation supports 104.

Figure 31A:
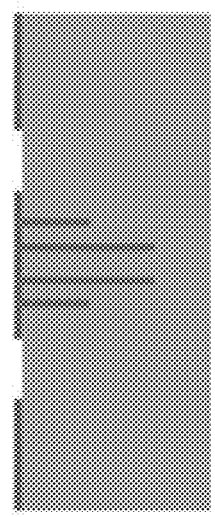
FIGS. 31A-I illustrate a fabrication flow for fabricating an embodiment with a single levitation support.

In some embodiments, a first fabrication step can be patterning a support stem 102 opening in a first oxide layer on a substrate 103, such as an annulus, for the support stem 102. The first step can further include anisotropically etching the substrate 103, creating an axisymmetric trench for the support stem 102. The first step can further include patterning a levitation support 104 opening in the oxide layer on the substrate 103. This step is illustrated in FIG. 31A.

Figure 31B:
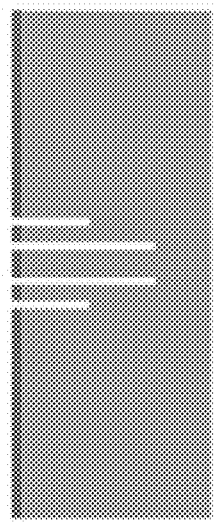

In some embodiments, a second fabrication step can include anisotropically etching the substrate 103 to create an axisymmetric trench for the levitation support 104. In some embodiments, this step will also increase the depth of the trench for the support stem 102. This step is illustrated in FIG. 31B.

Figure 31C:
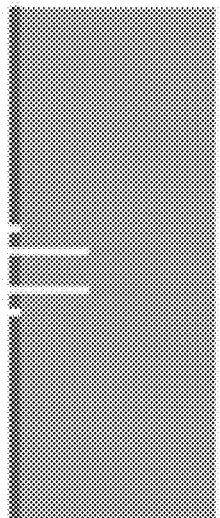

In some embodiments, a third fabrication step can include depositing or growing a second oxide layer, which fills the support stem 102 trench and levitation support 104 trench. This step can further include patterning an axisymmetric opening, larger than, but concentric with, the support trench and levitation support 104 trench. As with the processes outlined above, this patterning step can further comprise patterning electrode trenches in the substrate 103. This step is illustrated in FIG. 31C.

Figure 31D:
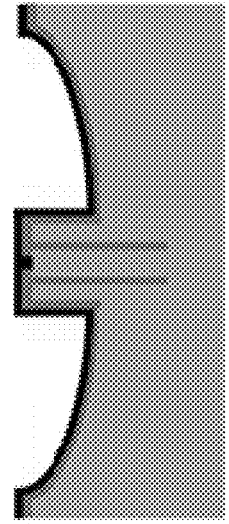

In some embodiments, a fourth fabrication step can include isotropically etching the substrate 103, creating a resonator body 101 mold in the substrate 103. This step is illustrated in FIG. 31D. In some embodiments, etching is performed using $SF_6$ and is hydrogen annealed at 1100° C. to slightly reflow the silicon and smoothen the sidewalls.

Figure 31E:
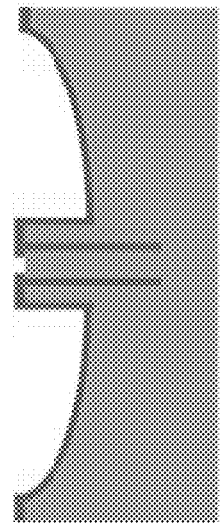

In some embodiments, a fifth fabrication step can include removing the first oxide layer from the substrate 103, and depositing or growing a second oxide layer on the substrate 103. This step can include patterning an axis-symmetric support connection opening in the second oxide layer. This support connection opening can be located in the center of the support trench. This step is illustrated in FIG. 31E.

Figure 31F:
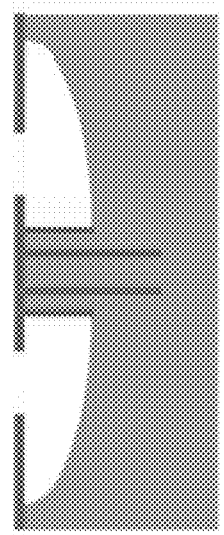

In some embodiments, a sixth fabrication step can include depositing a layer of resonator material, such as polysilicon, on the substrate 103. This step is illustrated in FIG. 31F.

Figure 31G:
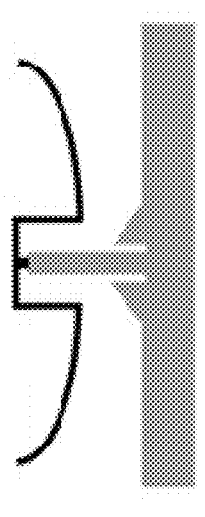

In some embodiments, a seventh fabrication step can include removing the resonator material from the top surface of the substrate 103, and depositing or growing a third oxide layer on the substrate 103. This step is depicted in FIG. 31G.

Figure 31H:
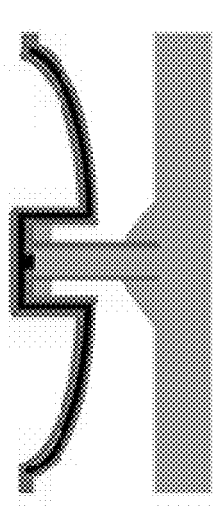

In some embodiments, an eighth fabrication step can include performing an isotropic etch on the substrate 103 to release the resonator body. This step is depicted in FIG. 31H. In some embodiments, this etch is a $XeF_2$ plasma etch.

Figure 31I:
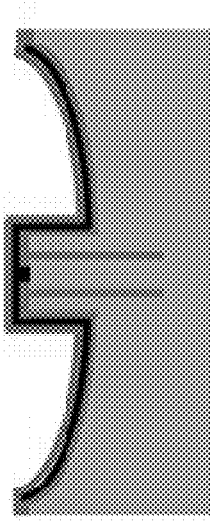

In some embodiments, a ninth fabrication step can include performing a HF release to remove remaining oxide or substrate 103 material from the resonator body. This step is depicted in FIG. 31I. In some embodiments, the HF release is short, which can minimize the damage to the polysilicon and improves yield significantly. FIG. 16 depicts a resonator assembly fabricated in accordance with an embodiment.

Experimental Results

In order to further understand the nature of energy dissipation of relatively simple µHRG designs, several batches were fabricated and tested.

Figure 32:
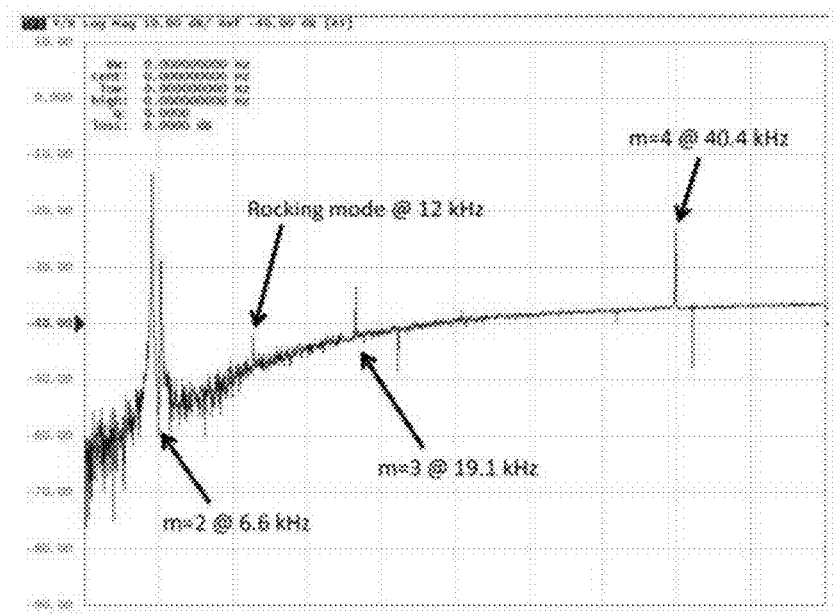
FIG. 32 is a graph showing the frequency response of a resonator at the m=2, m=3, and m=4 resonance modes.
Figure 33:
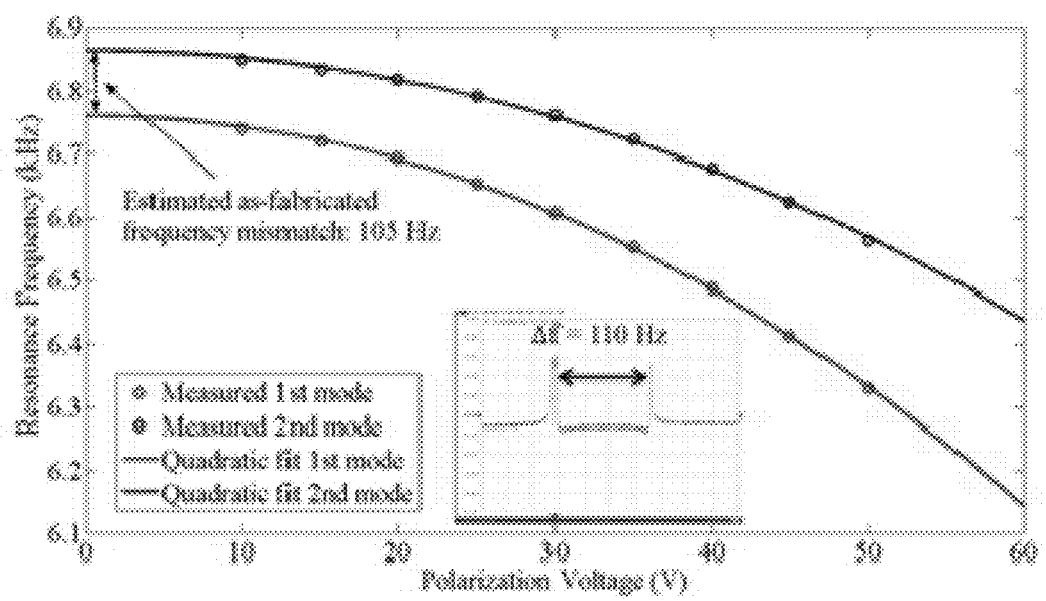
FIG. 33 is a graph of the electrostatic tuning of the two resonance modes of a resonator body.

First, a µHRG with a back-side DC contact was fabricated, with an electrode depth of 300 µm, and a 20 µm capacitative gap between the resonator and the electrodes. A hole was then etched in the back side to allow DC bias to be applied to the hemispherical shell. The fabricated back-side DC contact µHRG was mounted on an evaluation board and wirebonding is performed on the polysilicon electrodes. Resonator performance is characterized using a network analyzer (E5061B) while the board was placed inside a vacuum chamber with ~5 gTorr vacuum pressure. FIG. 32 shows the resonance peaks of the m=2, m=3, m=4 elliptical modes, and the rocking mode for a polysilicon µHRG with a shell thickness of 700 nm and a shell diameter of 1200 µm. The m=2, m=3 and m=4 resonances are measured to be at 6.7 kHz, 19.1 kHz and 40.2 kHz with quality factor 8,500, 7,000, and 10,400, respectively. FIG. 33 shows the electrostatic tuning curve of two degenerate m=2 modes. Polarization voltage is applied on the hemispherical shell from 10V to 50V. By quadratic curve fitting, the as-fabricated frequency mismatch, without any tuning effect, is estimated to be 105 Hz with $\Delta f/f=1.56\%$. In the current polysilicon µHRG design, the m=2 mode is selected as the working resonance modes due to its low resonance frequency and small frequency mismatch. The m=2 resonance mode shows a quality factor of 8,500. The measured quality factor does not represent the limit for a polysilicon µHRG, which is believed to be in the hundreds of thousands. A thermoelastic damping (TED) analysis shows much lower material dissipation (QTED~1 million). Due to the extremely small stiffness of this structure (~1 N/m), the drive amplitude can be as high as a few micrometers with large capacitive gaps of 20 µm. Nonlinearity of resonance peaks can be easily observed if input RF power exceeds −20 dBm. COMSOL multi-physics simulation confirms that with an RF power of −24 dBm and a DC polarization voltage of 26 V, drive vibration amplitude of 3 µm can be achieved. The testing results demonstrate a highly symmetrical hemispherical shell resonator with high quality factor for use in high performance µHRGs.

Figure 34:
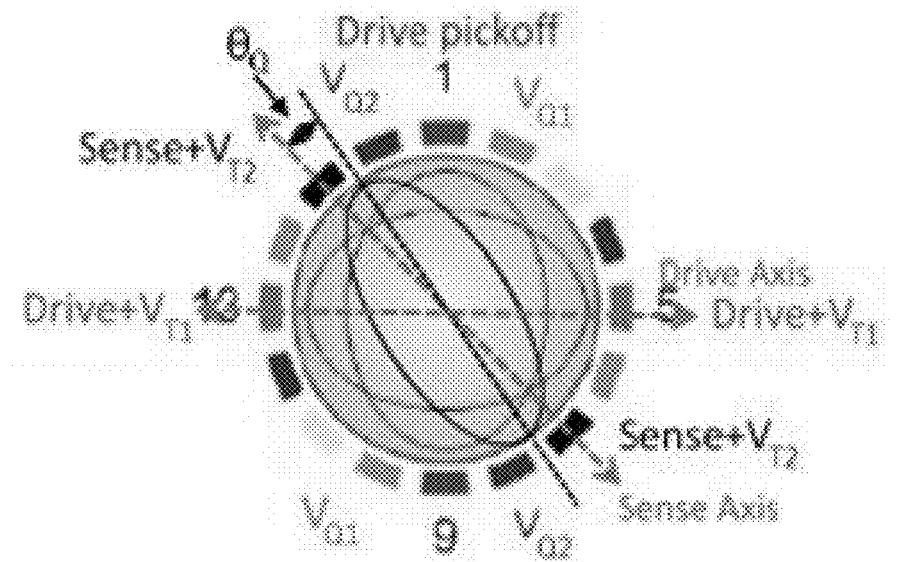
FIG. 34 is a diagram depicting the electrode configuration for a μHRG in accordance with an embodiment.
Figure 35:
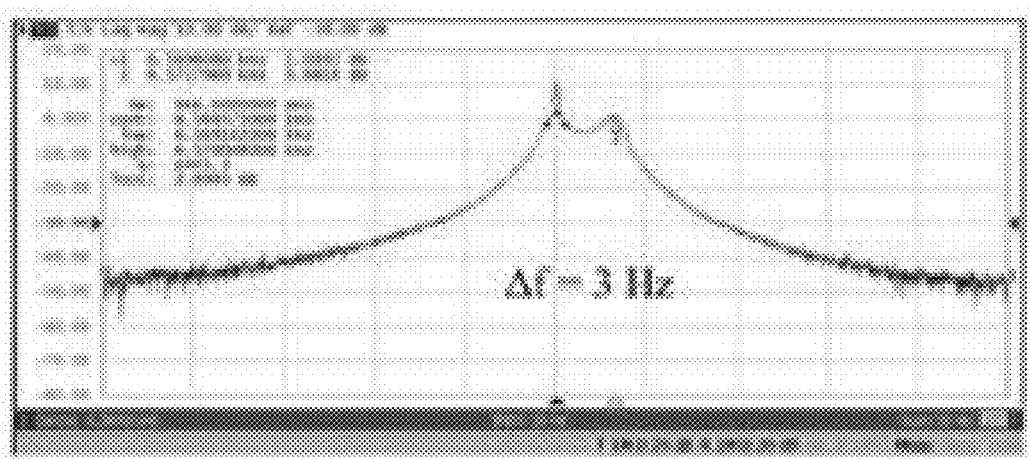
FIG. 35 is a graph depicting the resonance peaks for the two vibration modes of a μHRG used in an experiment while nearly mode-matched, illustrating a 3 Hz frequency split.
Figure 36:
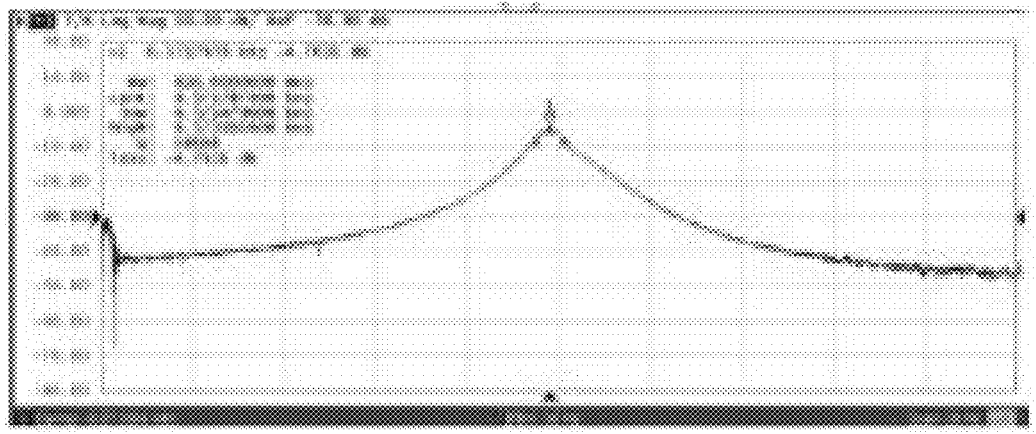
FIG. 36 is a graph depicting the resonance peaks for the two vibration modes of the μHRG of FIG. 35 when the resonator is mode-matched.

The performance of the resonator was then measured. Mode matching and balancing of the µHRG is performed using the approach described in B. J. Gallacher et al., *Electrostatic correction of structural imperfections present in a microring gyroscope,* 14 J. OF MICROELECTROMECHANCIAL SYSTEMS 221-34 (2005), which is hereby incorporated by reference as if fully set forth herein. As FIG. 34 shows, two sets of tuning electrodes ($V_{T1}$, $V_{T2}$) and two sets of balancing electrodes ($V_{Q1}$, $V_{Q2}$) are used. Tuning electrodes for the drive mode and sense mode are at the anti-nodes of both the drive mode and sense mode, respectively. Balancing or aligning electrodes that are at 22.5° to the drive anti-nodes and its equivalent position align the resonance modes with their principle axes. FIG. 35 shows the two peaks while nearly mode-matched with only 3 Hz frequency split, and FIG. 36 shows the mode matched resonance peak with an effective quality factor of 10,700.

Figure 37:
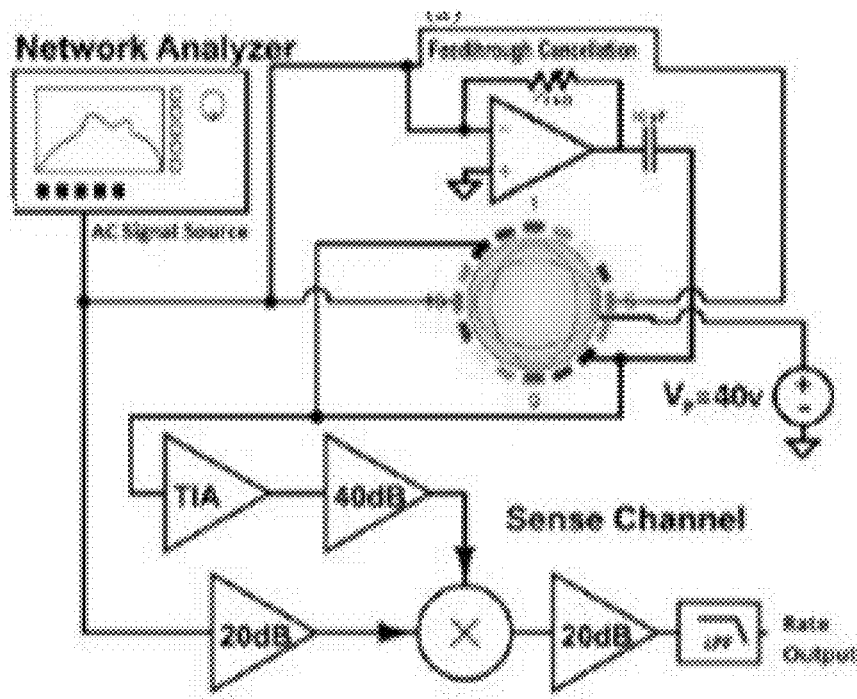
FIG. 37 is a diagram illustrating the circuit for operating a μHRG in an open-loop configuration.
Figure 38:
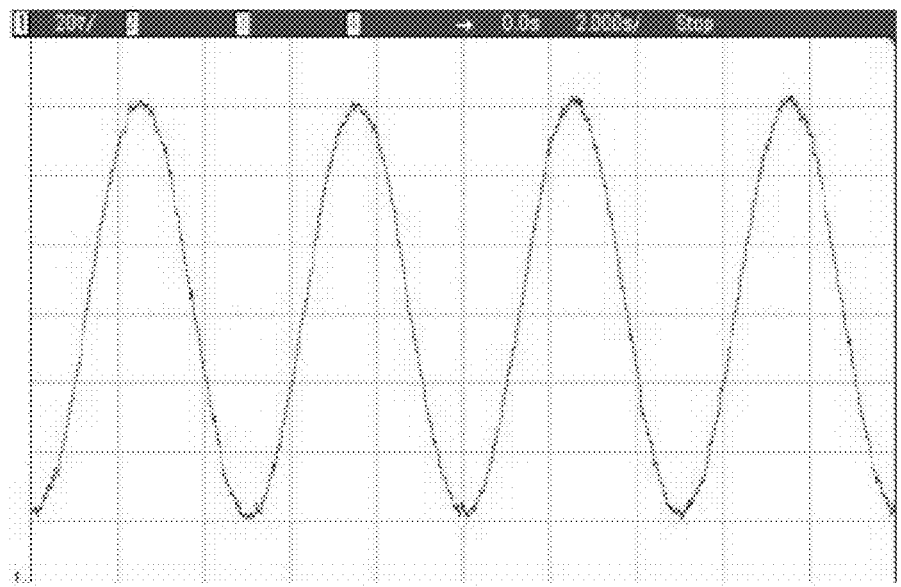
FIG. 38 is the output of an oscilloscope, illustrating the transient response of the μHRG of FIG. 35 to a 14°/s rotation rate.
Figure 39:
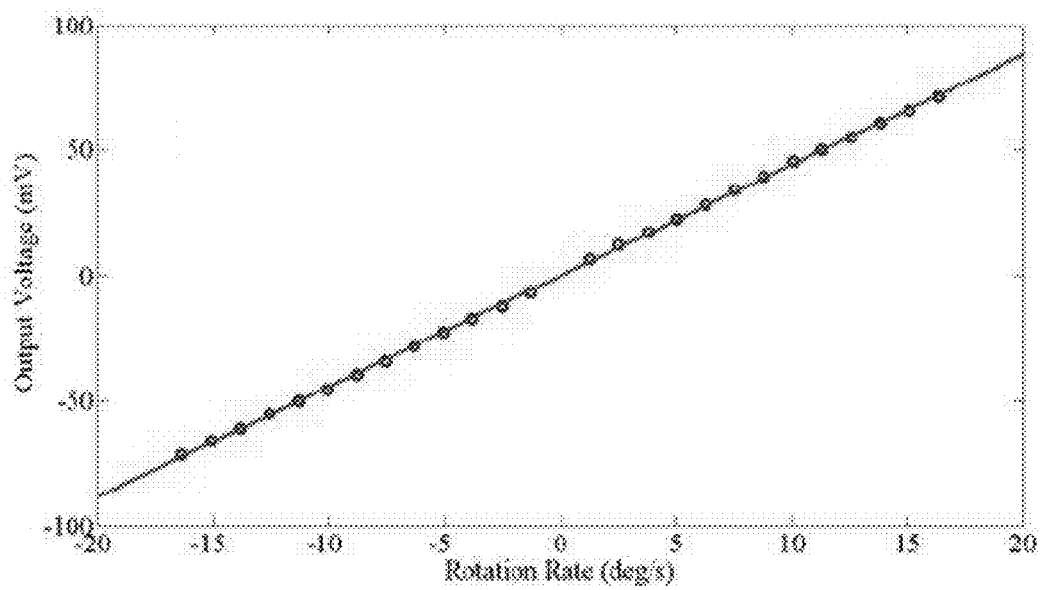
FIG. 39 is a graph illustrating the sensitivity of the μHRG of FIG. 35.

The mode-matched polysilicon μHRG is operated in an open loop configuration as shown in FIG. 37 by exciting the drive mode using an external sinusoidal signal at the exact resonance frequency and an RF power of −35 dBm. The device is polarized at 40 V. The Coriolis-induced signal is then processed by a transimpedance amplifier (TIA) with a gain of 500 kΩ and post amplification of 60 dB. After demodulation with the drive signal and low-pass filtering, the rotation rate information can be detected. The vacuum chamber is mounted on a rate table with a vacuum hose connected to the pump. The rate table is programmed to run at 200 mHz with an incremental rotation amplitude for different rotation rates. FIG. 38 demonstrates the transient response to a 14°/s rotation rate measured using an oscilloscope. It shows a very clean and linear sinusoidal output. Sensitivity is also measured by applying a rotation rate of up to 16°/s, as shown in FIG. 39. By linear regression, the sensitivity of the polysilicon μHRG is extracted to be 4.4 mV/(°/s). The preliminary characterization demonstrated a polysilicon microscale hemispherical resonating gyroscope working in rate mode.

Figure 40:
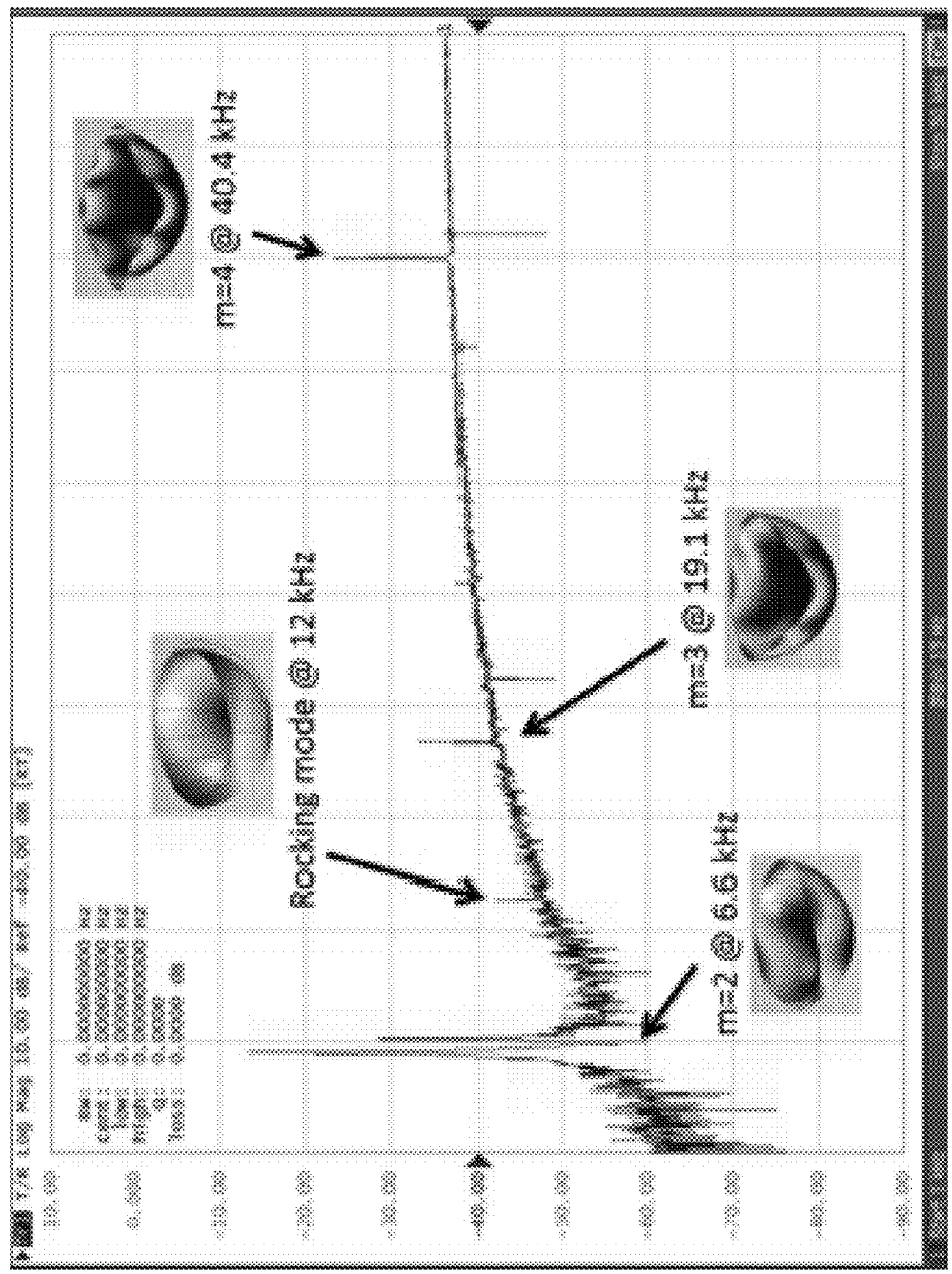
FIG. 40 is a graph of a frequency sweep across a resonator body, showing resonant frequencies for various modes of vibration.

Next, a pair of μHRG designs were tested to explore the relationship between support stem diameter and quality factor. Each device is first wire-bonded to provide electrical connection to a characterization PCB. Resonator performance is then characterized using a network analyzer (E5061B) while the board is placed inside a vacuum chamber with ~10 μTorr of vacuum pressure. The geometric dimensions and testing results for two different designs are listed in Table 1. The following figures show the measurement results of design #1, a device with a back-side DC contact. FIG. 40 shows the frequency response at a large frequency span covering different vibration modes. FIG. 33 shows the electrostatic tuning curve of two m=2 resonance peaks. The as-fabricated frequency mismatch between the m=2 degenerate modes is estimated to be 105 Hz by quadratic curve fitting. The inset shows the measured frequency mismatch of 110 Hz at a polarization voltage of 10V

TABLE 1

GEOMETRIC DIMENSIONS AND MEASURED RESULTS

| Design # | 1 | 2 |
|---|---|---|
| Resonator Body Thickness | 0.7 μm | 0.7 μm |
| Resonator Body Diameter | 1240 μm | 1240 μm |
| Support Stem Diameter | 170 μm | 40 μm |
| Frequency m = 2 | 6.7 kHz | 5.6 kHz |
| Quality Factor | 8,500 | 17,600 |
| Frequency Split | 100 Hz | 20 Hz |

The measured quality factors of the m=2 mode vary from 6,000 to 20,000 which could be correlated to various support sizes caused by different release times. Higher order modes (m=3, m=4) usually have higher quality factors. FIG. 40 shows the quality factor of the m=2, m=3, m=4, and rocking modes of design #2, illustrating the m=2 mode at 5.58 kHz with a Q of 17,600, the m=3 mode at 18.4 kHz with a Q of 79,000 and the m=4 mode at 32.7 kHz with a Q of 61,000. This suggests that the Qs of m=3 and 4 mode are dominated by loss mechanisms other than support loss. At the time of its maximum deformation, the energy stored in the resonator body 101 is the strain energy integrated over the entire volume, and it can be assumed that the dissipated energy is related to the portion of strain energy located on top of the support. Assuming the strain energy at the support area is totally dissipated, a lower bound of the 0 can be estimated by Equation 1. If there is any energy reflected by the support (or substrate 103) structure, the $Q_{support}$ can be higher than the estimated value.

TABLE 2

SUPPORT LOSS ESTIMATION

| Mode # | 2 | 3 | 4 |
|---|---|---|---|
| $Q_{support}$ (lower bound) | 5,700 | 2,600,000 | 1,080,000,000 |

Table 2 shows the estimation of the lower bound of $Q_{support}$ by this approach for a support diameter 1/10th the diameter of the resonator body. By increasing the mode number by one, the lower bound of $Q_{support}$ increases by three orders of magnitude. One explanation for this increase is that the energy is concentrated at the rim and has less interaction with the support for higher order modes. Since such an increase in Q was not observed, one can conclude that only the m=2 mode is limited by support loss, and not the m=3 or m=4. Other dissipation mechanisms such as surface effects can be taken into account for higher order modes.

Figure 42:
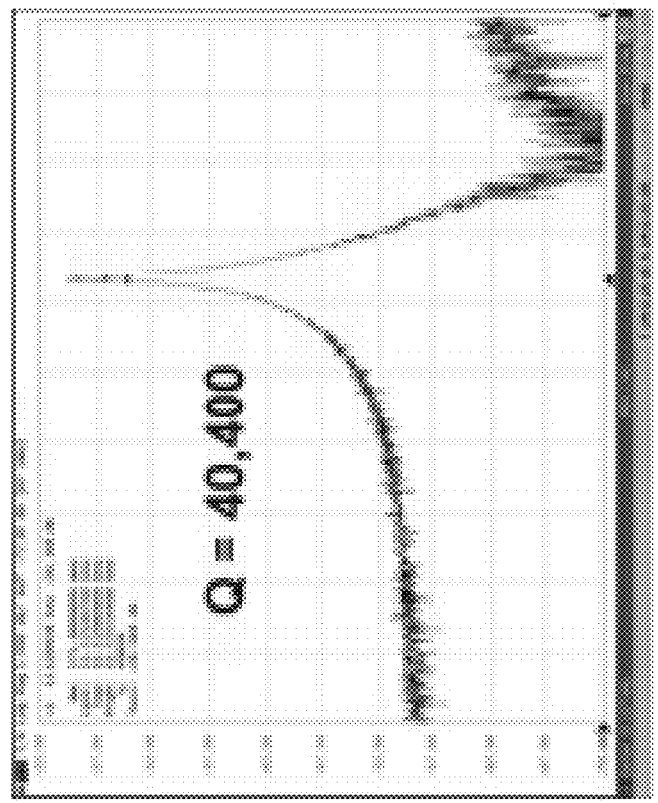
FIG. 42 depicts the quality factor of a resonator assembly with a long support stem.
Figure 41:
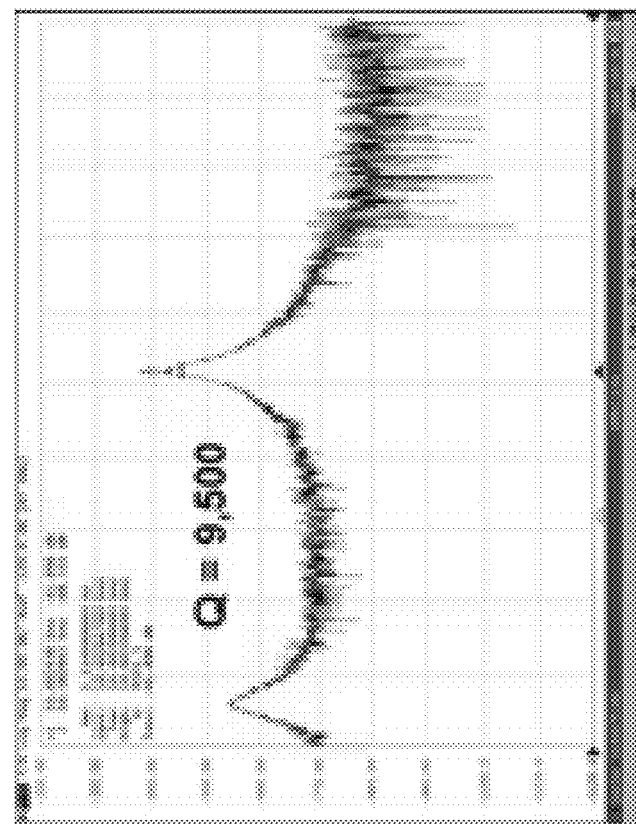
FIG. 41 depicts the quality factor of a resonator assembly with a short support stem.

From the analysis above, support loss can be the major limiting factor on the Q of the m=2 mode, and it can be improved by support structure optimization. In order to further decouple the vibration modes from the substrate 103, a long stem can be attached to the bottom of the resonator body 101 and serves as the support similar to the real structure of the macroscale HRG. Longer $XeF_2$ release and HF release is performed on a polysilicon μHRG of design #1 with a back-side DC contact. The polysilicon deposited on the side wall of the through hole creates a cylindrical tube that acts as a long stem as shown in FIG. 24L. An experiment is performed on a polysilicon μHRG with diameter of 900 μm and thickness of 700 nm by varying the release time in $XeF_2$ and HF. Devices from the same wafer with a long support stem 102 shows a 4× quality factor improvement over devices without a long stem. For example, FIG. 41 shows a Q of 9,500 for devices without a long stem and FIG. 42 shows a Q of 40,400 for devices with a long stem.

Figure 43:
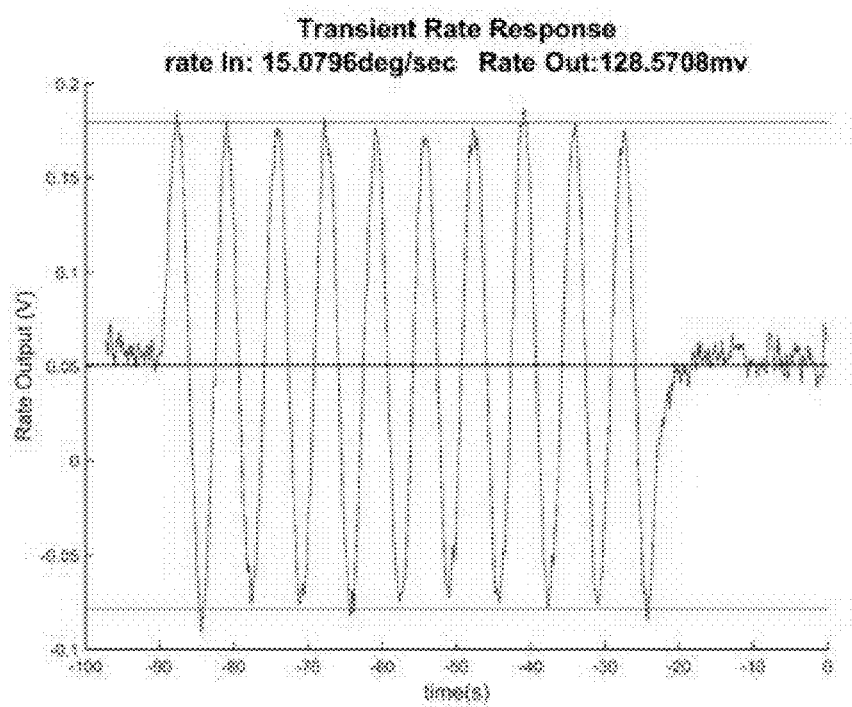
FIG. 43 depicts the transient response for a resonator with a large support diameter.
Figure 44:
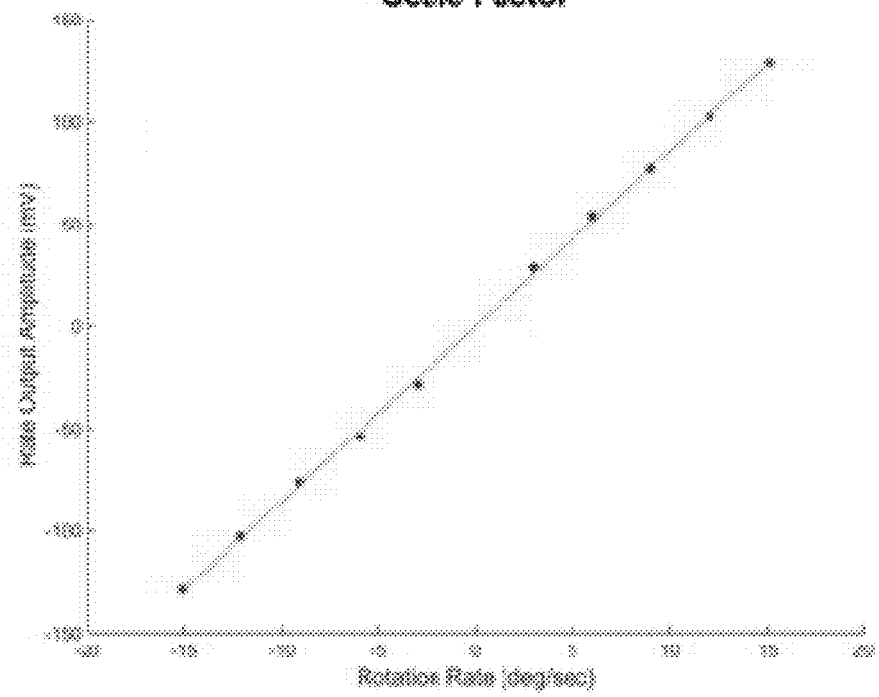
FIG. 44 depicts the sensitivity for a resonator assembly with a large support diameter.

The polysilicon μHRG of design #1 is interfaced with control electronics and the closed loop angular rate sensitivity is measured. A mode-matched polysilicon μHRG formed with a back-side DC contact is operated in a closed-loop configuration by forming an oscillator with the drive forcer and pick-off electrodes. An automatic level control circuit regulates the drive pickoff to give a drive forcer amplitude of approximately 5 mV. The device is polarized at 14V. The Coriolis-induced signal is then processed by a TIA with a gain of 500 kΩ and post amplification of 60 dB. After demodulation with the regulated drive signal and low-pass filtering, the rotation rate information can be detected. The rate table is programmed to run at 150 mHz with an incremental rotation amplitude for different rotation rates. FIG. 43 demonstrates the transient response to a 38°/s rotation rate measured using an oscilloscope. Sensitivity is also measured by applying a rotation rate of up to 15.1°/s. FIG. 44 illustrates the relationship between rotation rate and rate output amplitude. By linear regression, the scale factor of the polysilicon µHRG is extracted to be 8.57 mV/°/s).

While the present disclosure has been described in connection with a plurality of exemplary aspects, as illustrated in the various figures and discussed above, it is understood that other similar aspects can be used or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims.

The invention claimed is:

1. A resonator assembly comprising:
   a substrate;
   a curved resonator body;
   a support stem having a first end attached to the substrate;
   a levitation support having a first end attached to the curved resonator body; and
   a ring attached to at least a portion of a perimeter of the resonator body;
   wherein a second end of the levitation support is attached to a second end of the support stem; and
   wherein the support stem is at least partially disposed within the levitation support.

2. The resonator assembly of claim 1, wherein the curved resonator body is made of a material selected from the group consisting of fused quartz, polysilicon, monocrystalline silicon, metallic materials, and mixtures thereof.

3. The resonator assembly of claim 1, wherein the curved resonator body is a hemisphere.

4. The resonator assembly of claim 1, wherein the curved resonator body comprises a flat disk and a curved rim.

5. The resonator assembly of claim 1 further comprising a DC contact on a surface of the curved resonator body.

6. The resonator assembly of claim 1 further comprising a DC contact on the substrate in electrical communication with the support stem.

7. The resonator assembly of claim 1 further comprising a metallic layer on a surface of the curved resonator body.

8. The resonator assembly of claim 7, wherein a portion of the metallic layer is eutectically bonded to the curved resonator body.

9. A microhemispherical gyroscope comprising:
   the resonator assembly of claim 1; and
   a plurality of capacitive electrodes proximate to a circumference of the curved resonator body;
   wherein each capacitive electrode of the plurality of capacitive electrodes is an approximately equal distance from the curved resonator body of the resonator assembly.

10. The resonator assembly of claim 1, wherein the curved resonator body has a diameter of between 500 µm to 5 mm.

11. The resonator assembly of claim 1, wherein the curved resonator body has a thickness of between about 500 nm to 50 µm.

12. The resonator assembly of claim 1 further comprising a DC contact;
   wherein the substrate has a first and a second side;
   wherein the first end of the support stem attaches to the first side of the substrate;
   wherein the DC contact is on the second side of the substrate; and
   wherein the DC contact is in electrical communication with the support stem.

13. A resonator assembly comprising:
   a resonator body having a perimeter;
   a substrate having a first and a second side;
   a support stem having a first end and a second end, wherein the first end is attached to the first side of the substrate;
   a levitation support having a first end and a second end, the first end of the levitation support attached to the resonator body, the second end of the levitation support attached to the second end of the support stem, and the support stem at least partially disposed within the levitation support; and
   a mass-loading ring attached to at least a portion of the perimeter of the resonator body.

14. The resonator assembly of claim 13, wherein the resonator body is a curved resonator body.

15. A microhemispherical gyroscope comprising:
   the resonator assembly of claim 13; and
   a plurality of capacitive electrodes proximate to a circumference of the curved resonator body;
   wherein each capacitive electrode of the plurality of capacitive electrodes is an approximately equal distance from the curved resonator body of the resonator assembly.

16. A microhemispherical gyroscope comprising:
   a resonator body having a diameter of between 500 µm to 5 mm and a thickness of between about 500 nm to 50 µm;
   a substrate having a first and a second side;
   a support stem having a first end and a second end, wherein the first end is attached to the first side of the substrate;
   a levitation support having a first end and a second end, the first end of the levitation support attached to the resonator body, the second end of the levitation support attached to the second end of the support stem, and the support stem at least partially disposed within the levitation support;
   mass-loading rings attached to at least a portion of the resonator body; and
   a plurality of capacitive electrodes proximate to the resonator body.

* * * * *